(12) United States Patent
Goto et al.

(10) Patent No.: US 12,334,902 B2
(45) Date of Patent: Jun. 17, 2025

(54) ACOUSTIC WAVE DEVICE WITH TRANSVERSE MODE SUPPRESSION

(71) Applicant: Skyworks Solutions, Inc., Irvine, CA (US)

(72) Inventors: Rei Goto, Osaka (JP); Koji Seo, Kyotanabe (JP); Keiichi Maki, Suita (JP)

(73) Assignee: Skyworks Solutions, Inc., Irvine, CA (US)

( * ) Notice: Subject to any disclaimer, the term of this patent is extended or adjusted under 35 U.S.C. 154(b) by 434 days.

(21) Appl. No.: 17/824,800

(22) Filed: May 25, 2022

(65) Prior Publication Data

US 2022/0286105 A1    Sep. 8, 2022

Related U.S. Application Data

(63) Continuation of application No. 16/723,990, filed on Dec. 20, 2019, now Pat. No. 11,368,137.
(Continued)

(51) Int. Cl.
*H03H 9/02* (2006.01)
*H03H 9/145* (2006.01)
(Continued)

(52) U.S. Cl.
CPC .... *H03H 9/02889* (2013.01); *H03H 9/02834* (2013.01); *H03H 9/145* (2013.01);
(Continued)

(58) Field of Classification Search
CPC .......... H03H 9/02889; H03H 9/02834; H03H 9/145; H03H 9/25; H03H 9/6483;
(Continued)

(56) References Cited

U.S. PATENT DOCUMENTS 7,576,471 B1    8/2009  Solal
8,294,331 B2   10/2012  Abbott et al.
(Continued)

FOREIGN PATENT DOCUMENTS

WO    WO 2017/161303    9/2017

OTHER PUBLICATIONS

Mimura et al., "Low Acoustic Velocity Rayleigh SAW Technology for Miniaturization of High Performance TC-SAW Devices," Seventh International Symposium on Acoustic Wave Devices for Future Mobile Communication Systems., 2018.
(Continued)

*Primary Examiner* — Rakesh B Patel
*Assistant Examiner* — Jorge L Salazar, Jr.
(74) *Attorney, Agent, or Firm* — Knobbe, Martens, Olson & Bear, LLP

(57) ABSTRACT

Aspects of this disclosure relate to an acoustic wave device with transverse mode suppression. The acoustic wave device can include a piezoelectric layer, an interdigital transducer electrode, a temperature compensation layer, and a multi-layer mass loading strip. The mass loading strip has a density that is higher than a density of the temperature compensation layer. The mass loading strip can overlap edge portions of fingers of the interdigital transducer electrode. The mass loading strip can include a first layer for adhesion and a second layer for mass loading. The mass loading strip can suppress a transverse mode.

20 Claims, 20 Drawing Sheets

Related U.S. Application Data

(60) Provisional application No. 62/785,919, filed on Dec. 28, 2018.

(51) Int. Cl.
 *H03H 9/25* (2006.01)
 *H03H 9/64* (2006.01)
(52) U.S. Cl.
 CPC ............ *H03H 9/25* (2013.01); *H03H 9/6483* (2013.01); *H03H 9/6489* (2013.01)
(58) Field of Classification Search
 CPC ............ H03H 9/6489; H03H 9/02228; H03H 9/14532; H03H 9/1457; H03H 9/173; H03H 9/175
 USPC .......................................... 333/133, 193–196
 See application file for complete search history.

(56) References Cited

U.S. PATENT DOCUMENTS

| | | | |
|---|---|---|---|
| 8,741,683 B2 | 6/2014 | Huang et al. | |
| 10,090,825 B2 | 10/2018 | Kuroyanagi | |
| 11,368,137 B2 | 6/2022 | Goto et al. | |
| 12,136,910 B2 | 11/2024 | Goto | |
| 2012/0161577 A1 | 6/2012 | Abbott et al. | |
| 2013/0051588 A1 | 2/2013 | Ruile et al. | |
| 2015/0243873 A1 | 8/2015 | Nakanishi et al. | |
| 2016/0149553 A1 | 5/2016 | Yoon et al. | |
| 2017/0170808 A1 | 6/2017 | Iwaki et al. | |
| 2017/0331451 A1 | 11/2017 | Yoon et al. | |
| 2018/0054179 A1 | 2/2018 | Gamble et al. | |
| 2018/0097508 A1 | 4/2018 | Iwamoto et al. | |
| 2018/0269852 A1 | 9/2018 | Daimon et al. | |
| 2019/0089328 A1 | 3/2019 | Unterreithmeier | |
| 2019/0356296 A1 | 11/2019 | Mimura | |
| 2020/0212876 A1 | 7/2020 | Goto et al. | |
| 2020/0328727 A1 | 10/2020 | Daimon | |
| 2020/0389151 A1 | 12/2020 | Goto | |

OTHER PUBLICATIONS

Nakamura et al., "Suppression Mechanism of Transverse-Mode Spurious Responses in SAW Resonators on a SiO2/Al/LiNbO3 Structure", IEEE International Ultrasonics Symposium Proceedings, 2011.

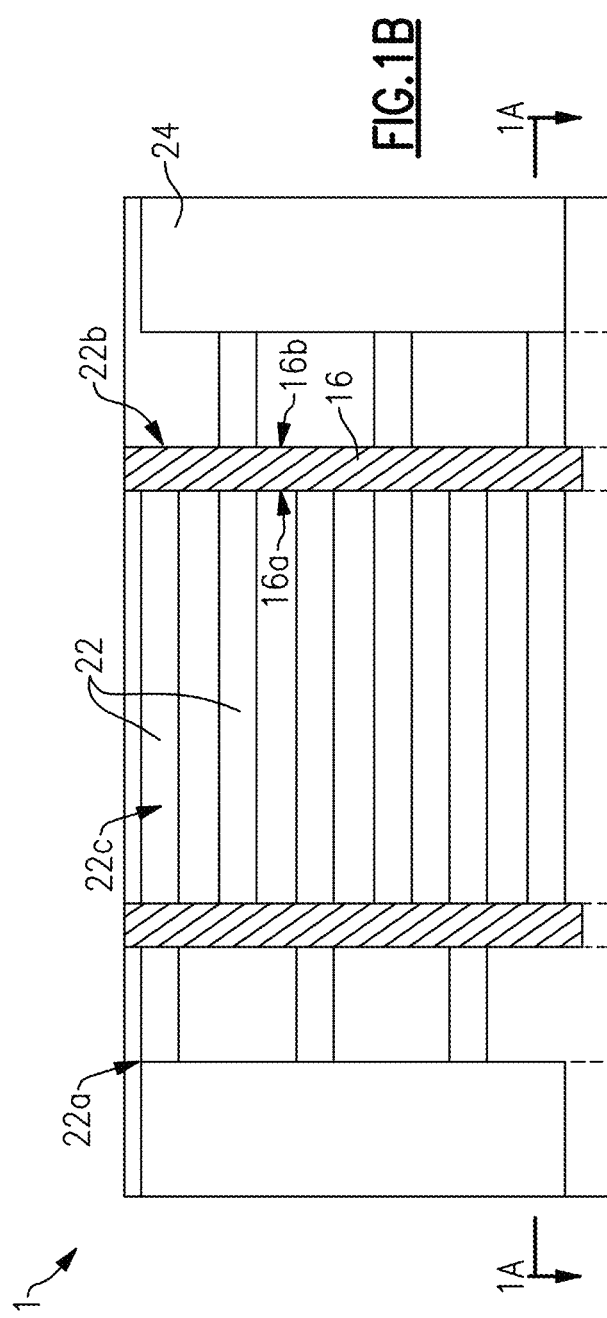
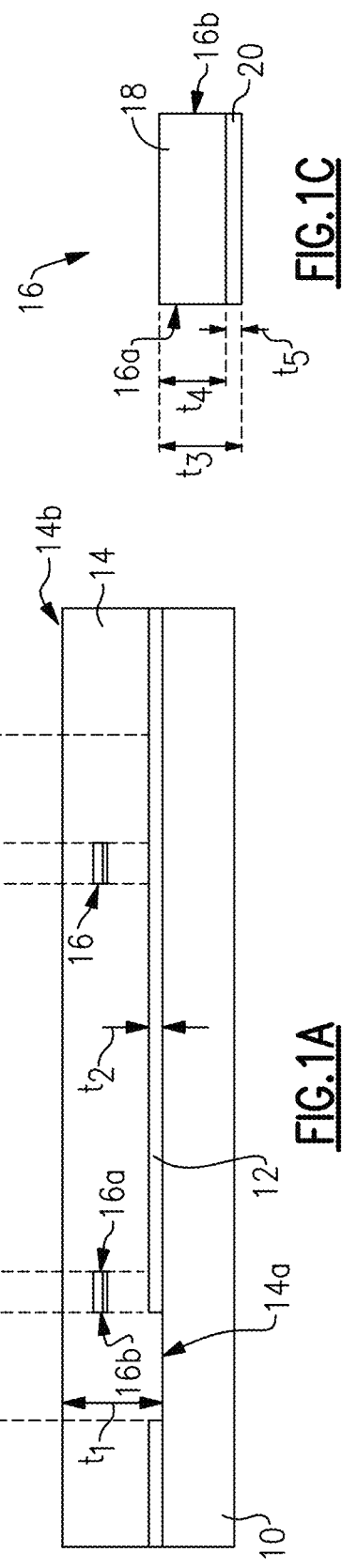
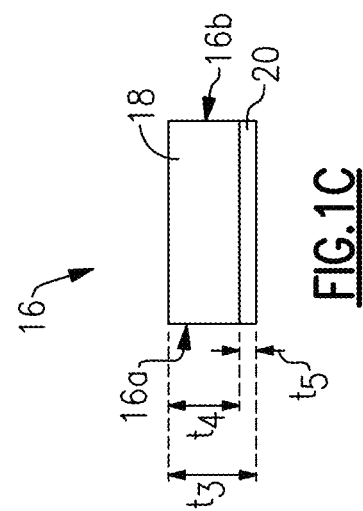

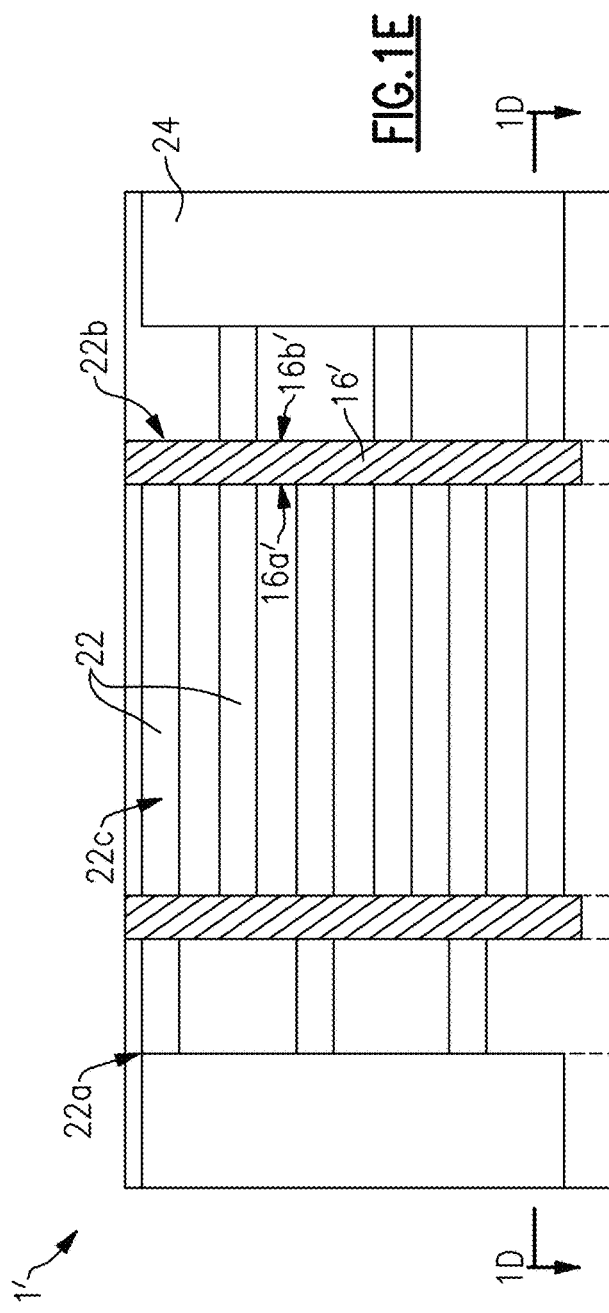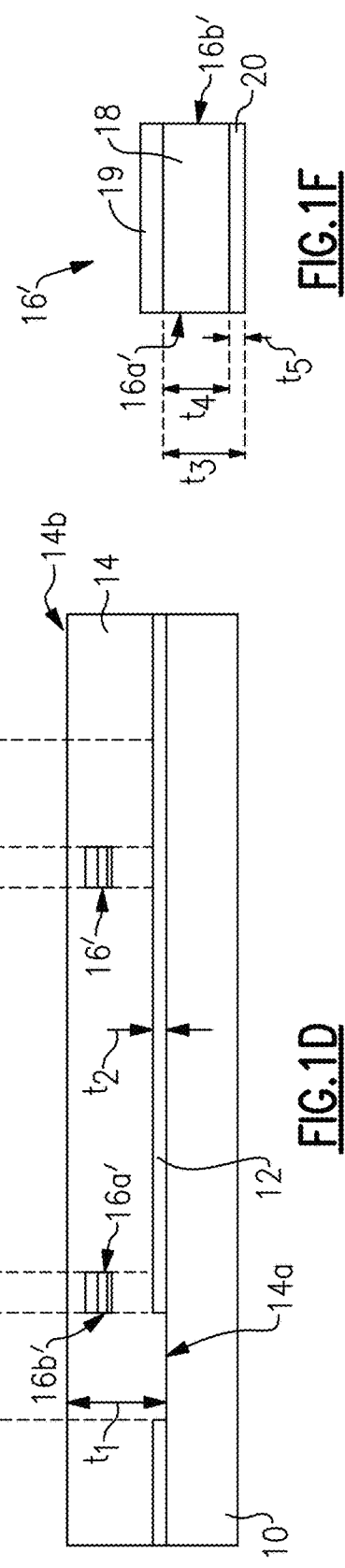

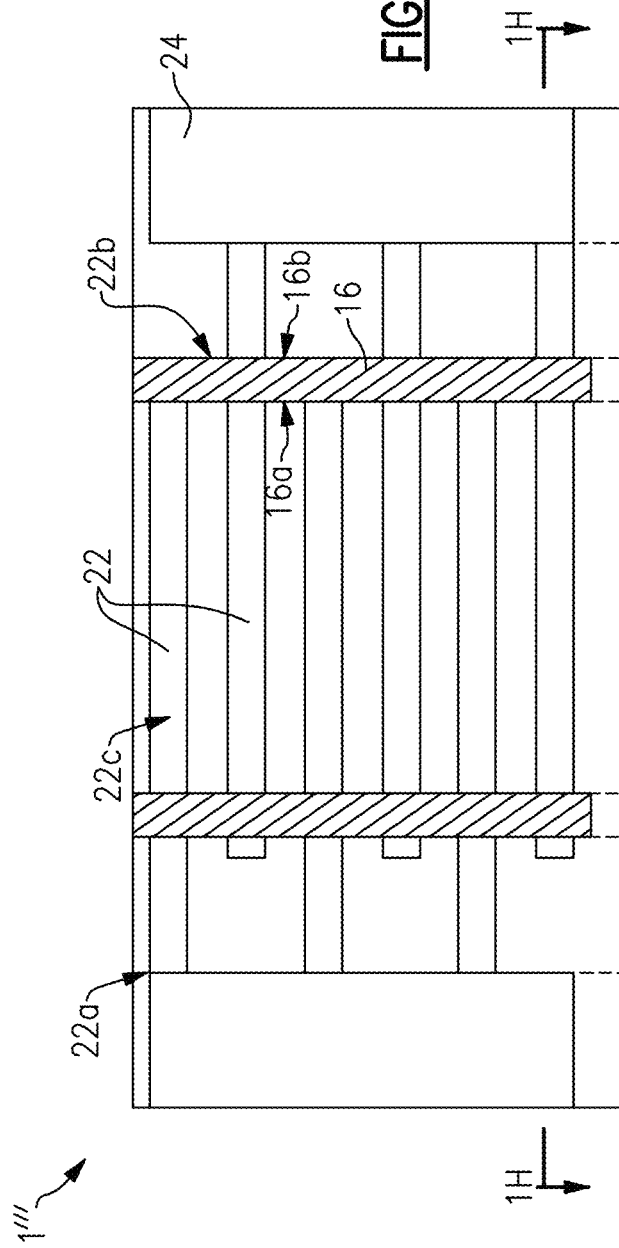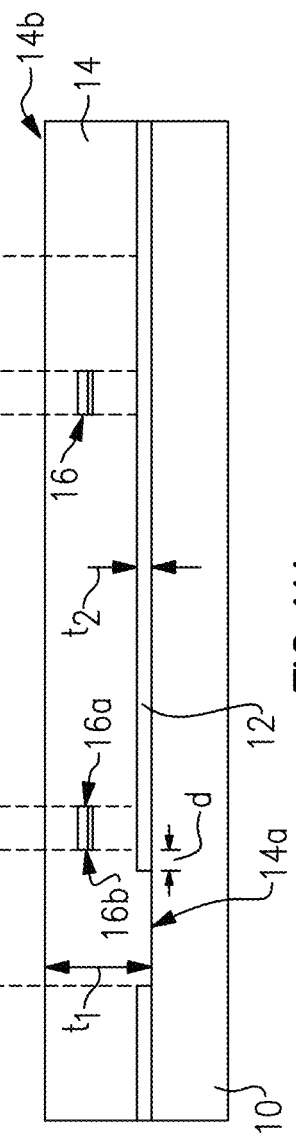

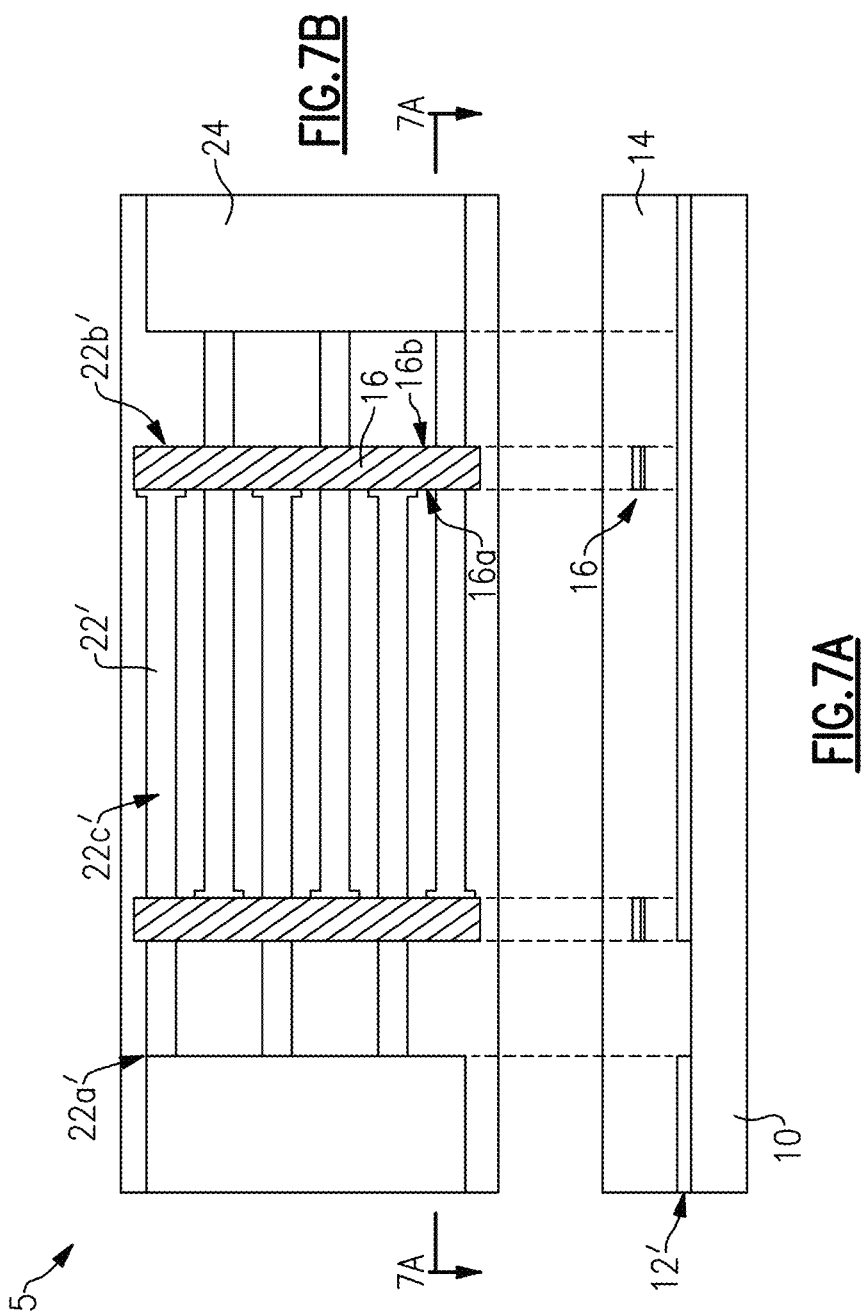

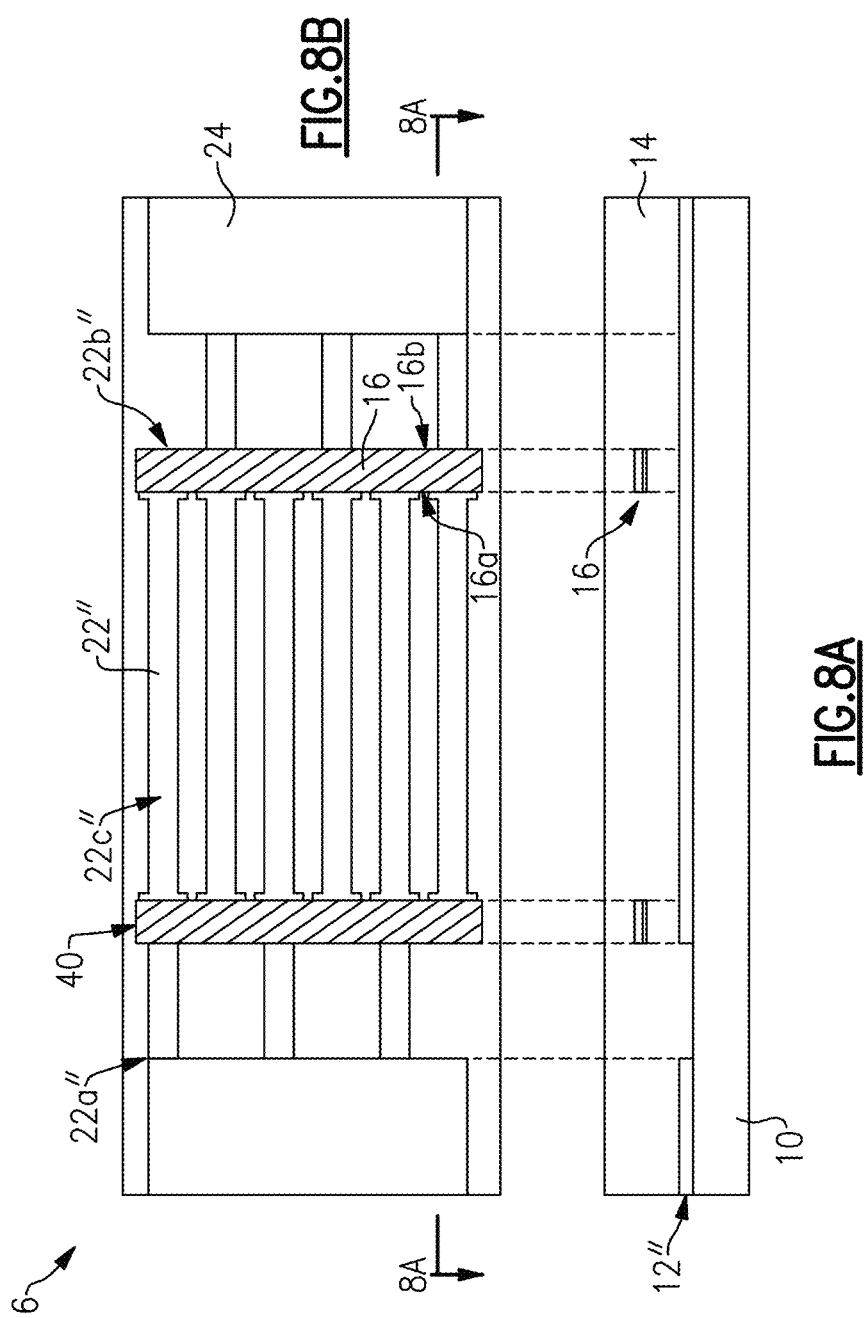

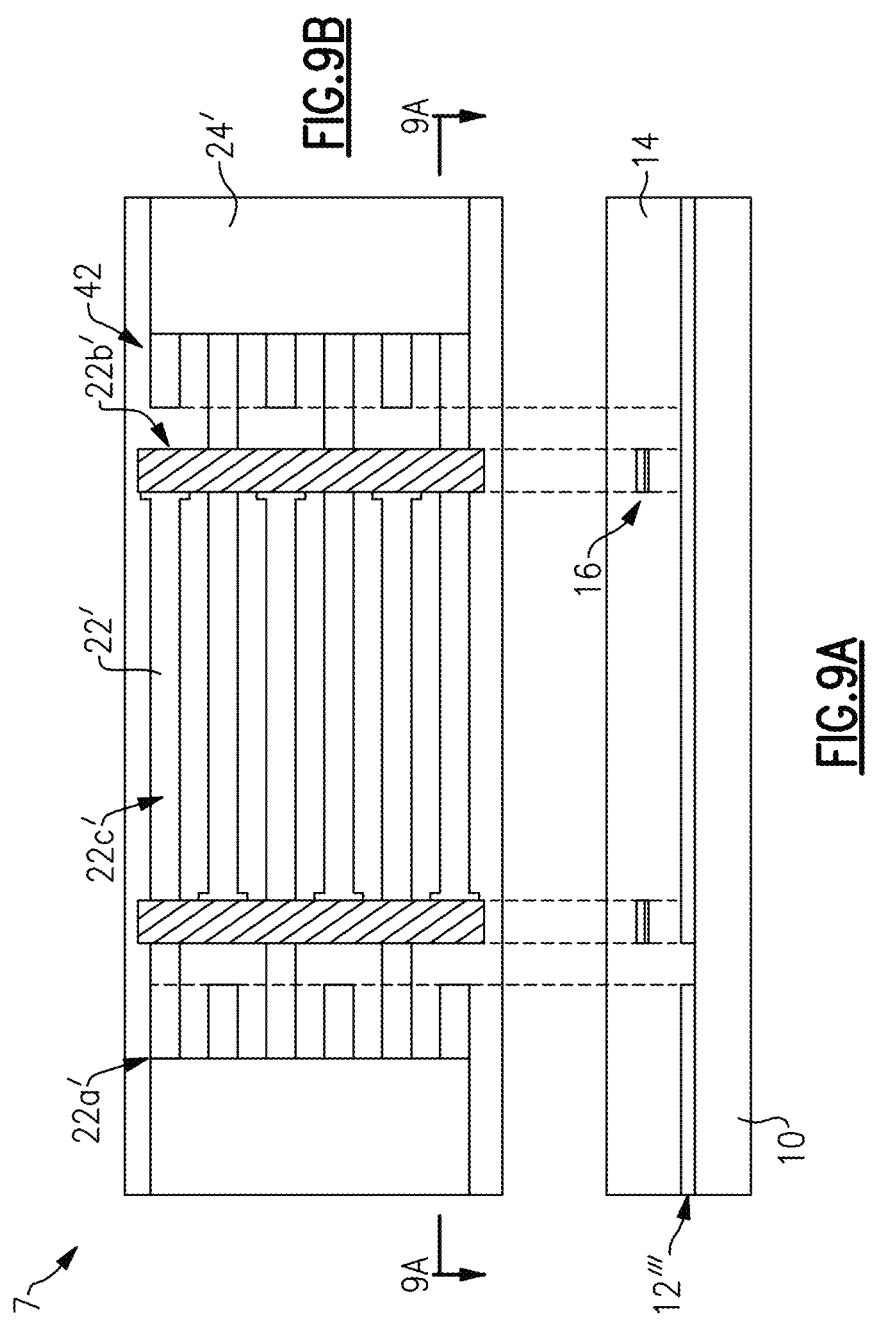

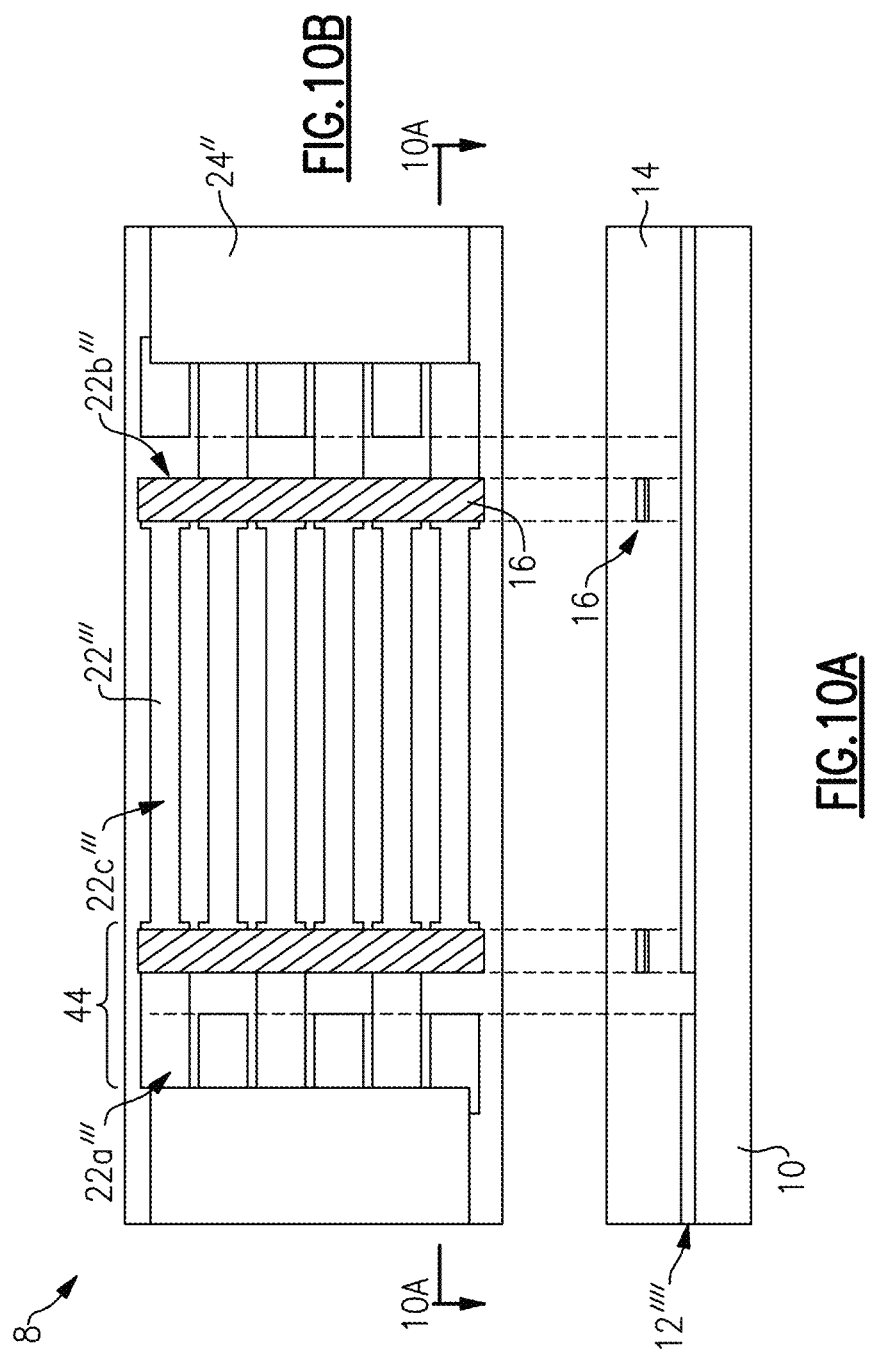

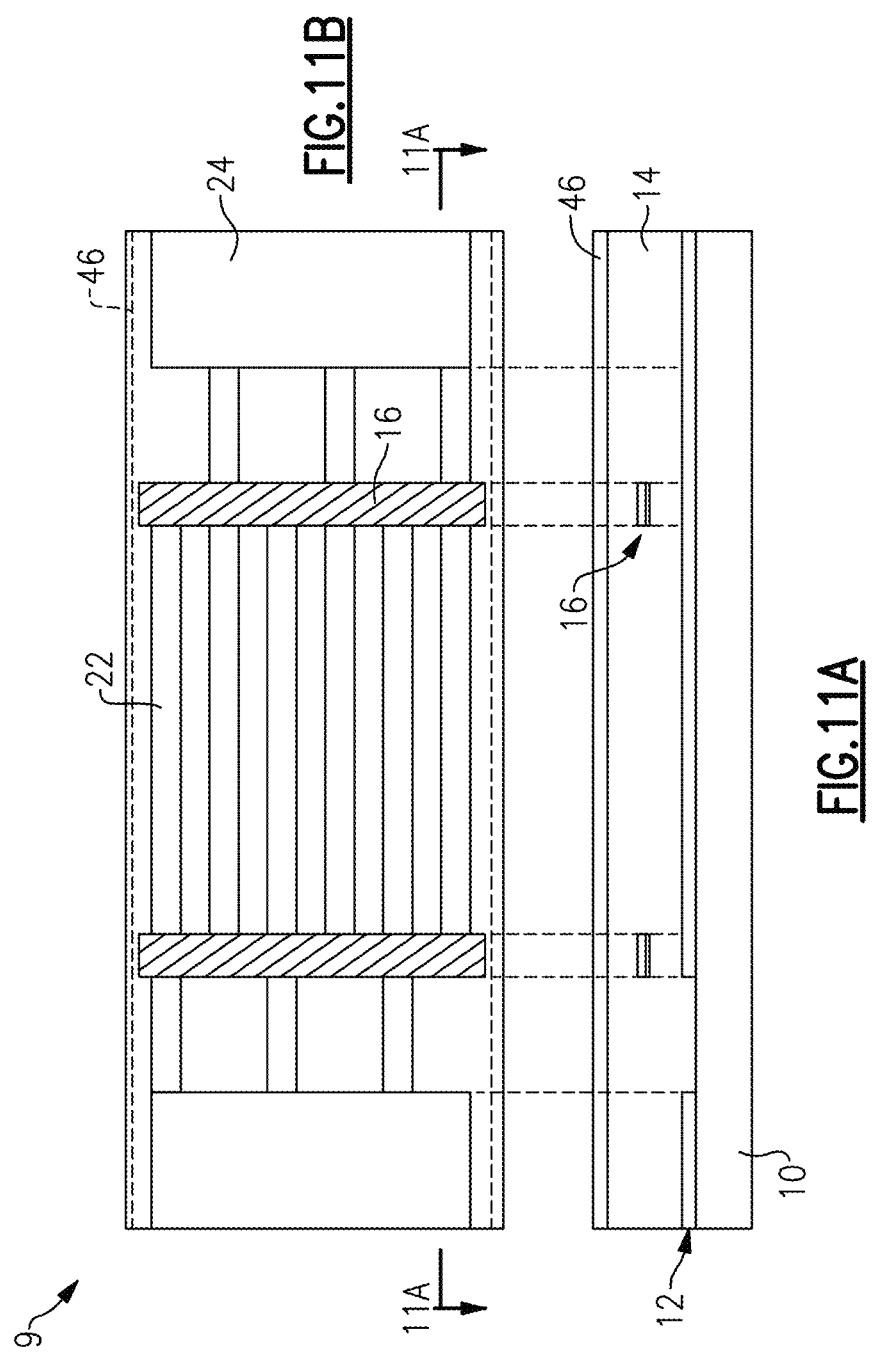

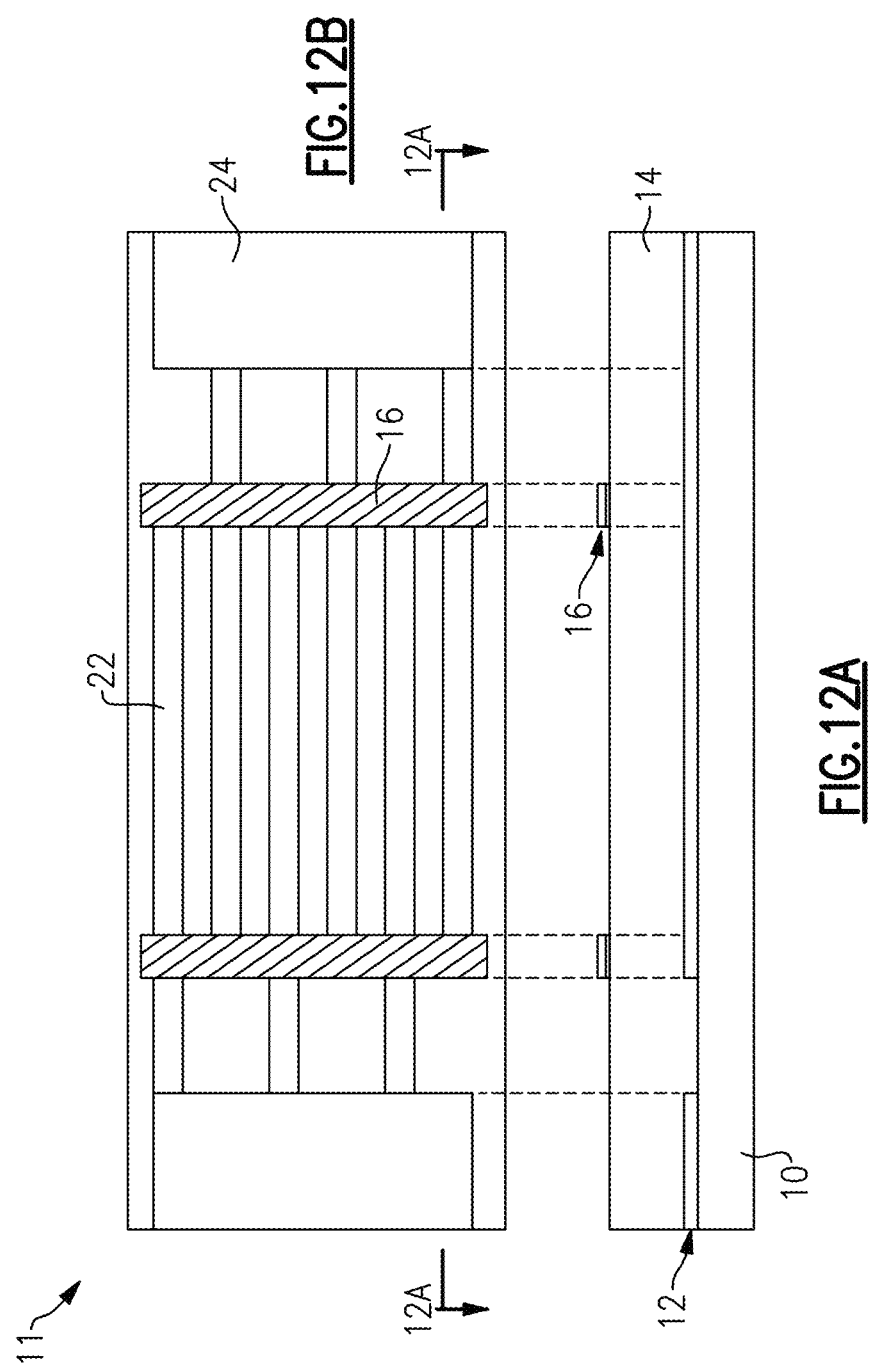

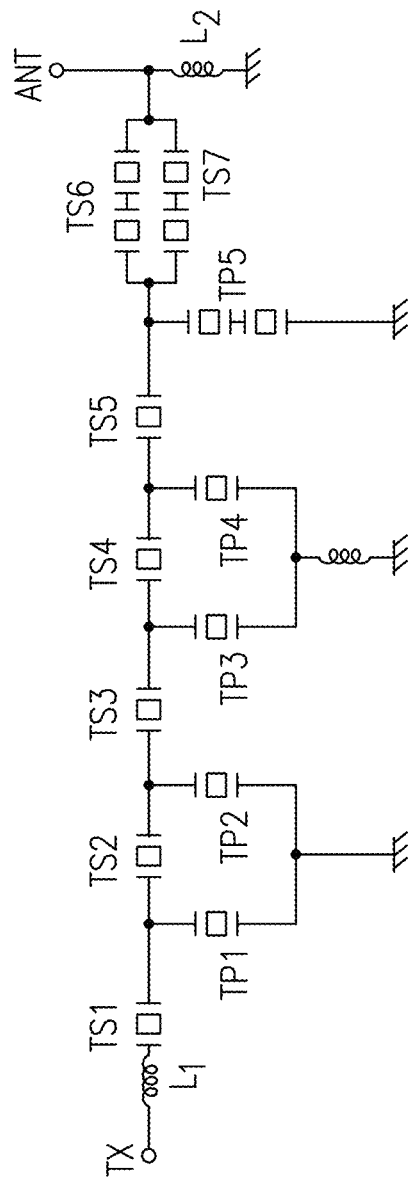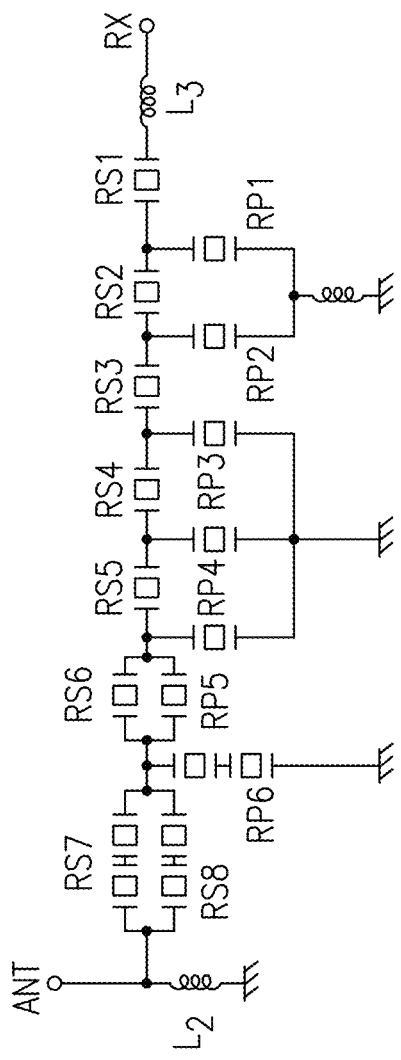

ACOUSTIC WAVE DEVICE WITH TRANSVERSE MODE SUPPRESSION

INCORPORATION BY REFERENCE TO ANY PRIORITY APPLICATIONS

Any and all applications, if any, for which a foreign or domestic priority claim is identified in the Application Data Sheet of the present application are hereby incorporated by reference under 37 CFR 1.57.

BACKGROUND

Technical Field

Embodiments of this disclosure relate to acoustic wave devices with transverse mode suppression.

Description of Related Technology

Piezoelectric microelectromechanical systems (MEMS) resonators can be used in radio frequency systems. Piezoelectric MEMS resonators can process electrical signals using mechanically vibrating structures. Example piezoelectric MEMS resonators include surface acoustic (SAW) resonators and temperature compensated surface acoustic wave (TC-SAW) resonators.

Acoustic wave filters can include TC-SAW resonators. Acoustic wave filters can filter radio frequency signals in radio frequency electronic systems. For instance, filters in a radio frequency front end of a mobile phone can include acoustic wave filters. Multiple acoustic wave filters can be arranged as a multiplexer, such as a duplexer.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

In one aspect an acoustic wave device is disclosed. The acoustic wave device can include a piezoelectric layer, an interdigital transducer electrode disposed over the piezoelectric layer, and a temperature compensation layer disposed over the interdigital transducer electrode. The interdigital transducer electrode include a bus bar and a plurality of fingers that extend from the bus bar. The fingers each includes an edge portion and a body portion. The acoustic wave device can also include a mass loading strip that overlaps the edge portions of the fingers. The mass loading strip has a density that is higher than a density of the temperature compensation layer. The mass loading strip includes a first layer and a second layer. A portion of the temperature compensation layer is positioned between the mass loading strip and the piezoelectric layer. The mass loading strip is arranged to suppress a transverse mode.

In one embodiment, the first layer of the mass loading strip is positioned between the second layer of the mass loading strip and the interdigital transducer electrode. The first layer of the mass loading strip can have higher adhesion to the temperature compensation layer than the second layer of the mass loading strip. The second layer of the mass loading strip can have a higher mass than the first layer of the mass loading strip. The second layer of the mass loading strip is a conductive strip.

In one embodiment, the mass loading strip is positioned between the second layer of the mass loading strip and the interdigital transducer electrode. The first layer of the mass loading strip can include titanium. The second layer of the mass loading strip can include molybdenum. The interdigital transducer electrode can include molybdenum. The second layer of the mass loading strip can include at least one of tungsten, gold, silver, ruthenium, copper, platinum, or iridium.

In one embodiment, the first layer of the mass loading strip is positioned between the second layer of the mass loading strip and the interdigital transducer electrode. The second layer of the mass loading strip can have a mass sufficient to suppress the transverse mode.

In one embodiment, the mass loading strip is embedded in the temperature compensation layer.

In one embodiment, the acoustic wave resonator is configured to generate a surface acoustic wave.

In one embodiment, the temperature compensation layer is a silicon dioxide layer.

In one embodiment, the temperature compensation layer has a thickness from a lower surface to an upper surface opposite the lower surface. The mass loading strip can be spaced apart from the lower surface by a distance that is within 20% to 80% of the thickness of the temperature compensation layer.

In one embodiment, the acoustic wave resonator further includes a silicon nitride layer over the temperature compensation layer.

In one embodiment, the temperature compensation layer has a thickness from a lower surface to an upper surface opposite the lower surface. The mass loading strip can be spaced apart from the lower surface by a distance that is within 40% to 60% of the thickness of the temperature compensation layer.

In one embodiment, the second layer has a higher density than a density of the interdigital transducer electrode.

In one embodiment, the mass loading strip includes a third layer. The third layer of the mass loading strip can include titanium.

In one aspect, a surface acoustic wave resonator is disclosed. The surface acoustic wave resonator can include a piezoelectric layer, an interdigital transducer electrode disposed over the piezoelectric layer, and a temperature compensation layer disposed over the interdigital transducer electrode. The interdigital transducer electrode includes a bus bar and fingers extending from the bus bar. The fingers each includes an edge portion and a body portion. The surface acoustic wave resonator can also include a mass loading strip that overlaps the edge portions of the fingers. The mass loading strip includes a first layer and a second layer. The mass loading strip has a density that is higher than a density of the temperature compensation layer. The first layer is positioned between the second layer and the interdigital transducer electrode. The first layer having higher adhesion with the temperature compensation layer than the second layer. The second layer has a higher mass than the first layer. A portion of the temperature compensation layer is positioned between the mass loading strip and the piezoelectric layer. The surface acoustic wave resonator is configured to generate a surface acoustic wave. The mass loading strip is arranged to suppress a transverse mode.

In one embodiment, the first layer of the mass loading strip includes titanium. The second layer of the mass loading strip can include molybdenum. The second layer of the mass loading strip can include at least one of tungsten, gold, silver, ruthenium, copper, platinum, or iridium.

In one embodiment, the second layer has a mass density that is greater than or equal to a mass density of the interdigital transducer electrode.

In one embodiment, the mass loading strip is embedded in the temperature compensation layer.

In one embodiment, the temperature compensation layer is a silicon dioxide layer. The surface acoustic wave resonator can further include a silicon nitride layer disposed over the temperature compensation layer.

In one aspect, an acoustic wave filter is disclosed. The acoustic wave filter can include an acoustic wave resonator including a piezoelectric layer, an interdigital transducer electrode disposed over the piezoelectric layer, a temperature compensation layer disposed over the interdigital transducer electrode, and a multi-layer mass loading strip that overlaps edge portions of fingers of the interdigital transducer electrode. The multi-layer mass loading strip has a higher density than the temperature compensation layer. The acoustic wave filter can also include a plurality of other acoustic wave resonators that coupled to the acoustic wave resonator. The acoustic wave resonator and the other acoustic wave resonators are together arranged to filter a radio frequency signal.

In one embodiment, the multi-layer mass loading strip is a multi-layer mass loading strip.

In one embodiment, front end module can include the acoustic wave filter, additional circuitry, and a package that encloses the surface acoustic wave filter and the additional circuitry.

In one embodiment, the multi-layer mass loading strip includes a first layer and a second layer. The first layer can be positioned closer to the interdigital transducer electrode than the second layer. The first layer can have a higher adhesion to the temperature compensation layer than the second layer.

In one aspect, front end module including an acoustic wave filter, additional circuitry, and a package enclosing the surface acoustic wave filter and the additional circuitry is disclosed. The acoustic wave filter can include an acoustic wave resonator including a piezoelectric layer, an interdigital transducer electrode disposed over the piezoelectric layer, a temperature compensation layer disposed over the interdigital transducer electrode, and a multi-layer mass loading strip that overlaps edge portions of fingers of the interdigital transducer electrode. The multi-layer mass loading strip has a higher density than the temperature compensation layer. The acoustic wave filter can also include a plurality of other acoustic wave resonators that coupled to the acoustic wave resonator. The acoustic wave resonator and the other acoustic wave resonators are together arranged to filter a radio frequency signal.

In one embodiment, the additional circuitry includes a multi-throw radio frequency switch.

In one embodiment, the additional circuitry includes a power amplifier.

In one embodiment, a wireless communication device can include an antenna and an acoustic wave filter. The acoustic wave filter can include an acoustic wave resonator including a piezoelectric layer, an interdigital transducer electrode disposed over the piezoelectric layer, a temperature compensation layer disposed over the interdigital transducer electrode, and a multi-layer mass loading strip that overlaps edge portions of fingers of the interdigital transducer electrode. The multi-layer mass loading strip has a higher density than the temperature compensation layer. The acoustic wave filter can also include a plurality of other acoustic wave resonators that coupled to the acoustic wave resonator. The acoustic wave resonator and the other acoustic wave resonators are together arranged to filter a radio frequency signal.

In one aspect, a method of manufacturing an acoustic wave resonator is disclosed. The method can include providing an acoustic wave resonator with a temperature compensation layer disposed over an interdigital transducer electrode. The interdigital transducer electrode includes fingers that extend from a bus bar. The fingers each including an edge portion and a body portion. The method can also include forming a first layer of a mass loading strip that overlaps with the edge portions of the fingers of the interdigital transducer electrode. Material of the temperature compensation layer is positioned between the first layer of the mass loading strip and the interdigital transducer electrode. The method further includes depositing a second layer of the mass loading strip disposed over the first layer of the mass loading strip. The first layer of the mass loading strip has a higher adhesion than the second layer of the mass loading strip. The second layer of the mass loading strip has a higher mass than the first layer of the mass loading strip.

In one embodiment, the first layer includes titanium. The second layer can include molybdenum.

In one embodiment, the method comprises forming temperature compensation material over the second layer of the mass loading strip.

In one embodiment, the temperature compensation layer is a silicon dioxide layer.

In one embodiment, the first layer of the mass loading strip is formed within 20% to 80% of the thickness of the temperature compensation layer from a piezoelectric layer of the acoustic wave resonator.

In one embodiment, the method further include depositing a silicon nitride layer over the temperature compensation layer. The first layer of the mass loading strip can be positioned within 40% to 60% of the thickness of the temperature compensation layer from a piezoelectric layer of the acoustic wave resonator.

In one aspect, a method of filtering a radio frequency signal is disclosed. The method can include receiving a radio frequency signal at an input port of an acoustic wave filter that includes an acoustic wave resonator. The acoustic wave resonator includes a multi-layer mass loading strip overlapping edge portions of fingers of an interdigital transducer electrode. The method can also include filtering the radio frequency signal with the acoustic wave filter. The filtering includes suppressing a transverse mode using the multi-layer mass loading strip of the acoustic wave resonator.

In one embodiment, a first layer of the multi-layer mass loading strip has a higher adhesion to a temperature compensation layer than a second layer of the multi-layer mass loading strip. At least a portion of the temperature compensation layer can be positioned between the multi-layer mass loading strip and the interdigital transducer electrode. The second layer of the multi-layer mass loading strip can have a higher mass than the first layer of the multi-layer mass loading strip.

In one embodiment, the multi-layer mass loading strip includes a titanium layer.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

FIG. 1A illustrates a cross section of a surface acoustic wave (SAW) resonator according to an embodiment.

FIG. 1B illustrates a top view of the SAW resonator of FIG. 1A.

FIG. 1C illustrates a side view of the metal strip of the SAW resonator of FIG. 1A.

FIG. 1D illustrates a cross section of a SAW resonator according to another embodiment.

FIG. 1E illustrates a top view of the SAW resonator of FIG. 1D.

FIG. 1F illustrates a side view of the metal strip of the SAW resonator of FIG. 1D.

FIG. 1H illustrates a cross section of a SAW resonator according to an embodiment.

FIG. 1I illustrates a top view of the SAW resonator of FIG. 1H.

FIG. 7A illustrates a cross section of a SAW resonator according to another embodiment.

FIG. 7B illustrates a top view of the SAW resonator of FIG. 7A.

FIG. 8A illustrates a cross section of a SAW resonator according to another embodiment.

FIG. 8B illustrates a top view of the SAW resonator of FIG. 8A.

FIG. 9A illustrates a cross section of a SAW resonator according to another embodiment.

FIG. 9B illustrates a top view of the SAW resonator of FIG. 9A.

FIG. 10A illustrates a cross section of a SAW resonator according to another embodiment.

FIG. 10B illustrates a top view of the SAW resonator of FIG. 10A.

FIG. 11A illustrates a cross section of a SAW resonator according to another embodiment.

FIG. 11B illustrates a top view of the SAW resonator of FIG. 11A.

FIG. 12A illustrates a cross section of a SAW resonator according to another embodiment.

FIG. 12B illustrates a top view of the SAW resonator of FIG. 12A.

FIG. 14A is a schematic diagram of a transmit filter that includes surface acoustic wave resonators according to an embodiment.

FIG. 14B is a schematic diagram of a receive filter that includes surface acoustic wave resonators according to an embodiment.

DETAILED DESCRIPTION OF CERTAIN EMBODIMENTS

Figure 1G:
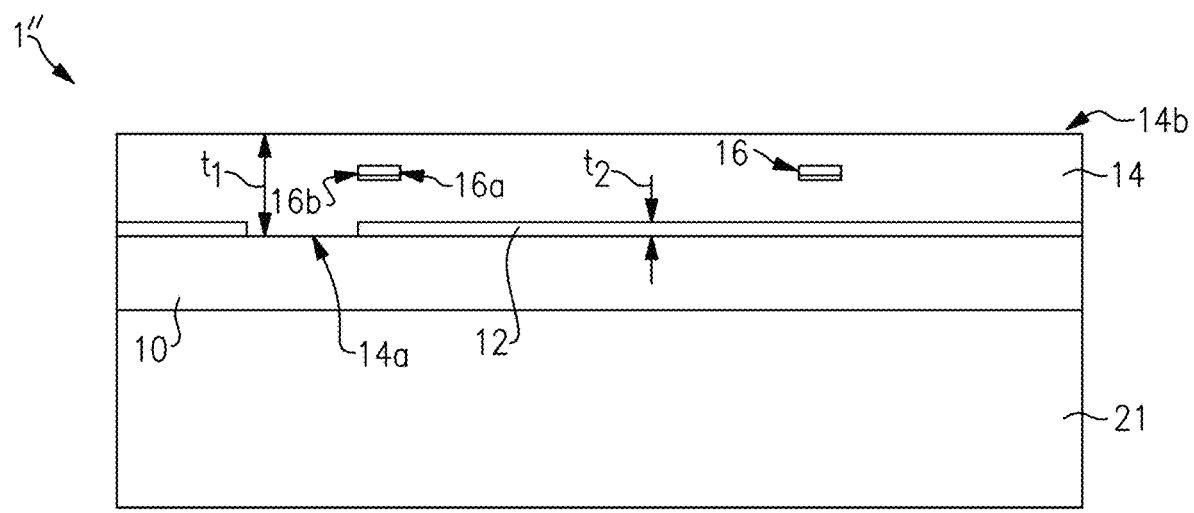
FIG. 1G illustrates a cross section of a SAW resonator according to another embodiment.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave filters can filter radio frequency (RF) signals in a variety of applications, such as in an RF front end of a mobile phone. An acoustic wave filter can be implemented with surface acoustic wave (SAW) devices. SAW devices include SAW resonators, SAW delay lines, and multi-mode SAW (MMS) filters (e.g., double mode SAW (DMS) filters).

In general, high quality factor (Q), large effective electromechanical coupling coefficient ($k^2_{eff}$), high frequency ability, and spurious free can be significant aspects for micro resonators to enable low-loss filters, stable oscillators, and sensitive sensors. SAW resonators can have a relatively strong transverse mode in and/or near a pass band. The presence of the relatively strong transverse modes can hinder the accuracy and/or stability of oscillators and sensors, as well as hurt the performance of acoustic filters by creating relatively severe passband ripples and possibly limiting the rejection.

Therefore, transverse mode suppression method is significant for SAW resonators. A technical solution for suppressing transverse modes is to create a border region with a different velocity from a central part of the active region according to the mode dispersion characteristic. This can be referred to as a "piston mode." A piston mode can be obtained to cancel out the transverse wave vector in a lateral direction without significantly degrading the $k^2$ or Q. By including a relatively small border region with a slow velocity on the edge of the acoustic aperture of a SAW resonator, a propagating mode can have a zero (or approximately zero) transverse wave vector in the active aperture. This may be achieved by providing a multi-layer conductive strip on edges of an interdigital transducer (IDT) electrode active regions of the SAW resonator. The transverse wave vector can be real in the border region and imaginary on a gap region. A piston mode SAW resonator can have even order modes that have a multiple of full wave lengths in the active region, which should not significantly couple to electrical domain.

When a relatively high density metal strip is used to achieve a piston mode in a temperature compensated surface acoustic wave (TC-SAW) resonator, the high density metal strip can be buried in a temperature compensation layer. The high density metal strip may have a relatively weak adhesion with the temperature compensation layer. A relatively weak adhesion strength between the high density metal strip and the temperature compensation layer can lead to delamination of the high density metal strip from the temperature compensation layer. When the delamination occurs, the transverse mode may not be sufficiently suppressed.

A metal strip can include molybdenum to obtain mass loading for piston mode operation. However, molybdenum is not particularly adhesive and can experience delamination. Titanium has good adhesion. However, titanium may not have sufficient mass loading desired for piston mode operation. A stacked molybdenum/titanium strip is provided to obtain adherence and mass loading for piston mode operation in an acoustic wave resonator. Titanium can provide desirable crystal orientation for an overlying layer, such as a molybdenum layer over the titanium.

Aspects of this disclosure relate to SAW resonators (e.g., TC-SAW resonators) that include a metal strip that includes a high density metal layer and an adhesion layer. The metal strip can be buried in a temperature compensation layer, such as a silicon dioxide layer. The adhesion layer can provide an adhesion strength that can mitigate and/or prevent delamination of the metal strip from the temperature compensation layer. The high density layer can provide mass loading for piston mode operation. Accordingly, a SAW device with a multi-layer mass loading strip is disclosed.

Although embodiments may be discussed with reference to multi-layer metal strips or multi-layer conductive strips, any suitable principles and advantages disclosed herein can be applied to a multi-layer mass loading strip that includes one or more non-conductive layers. Moreover, although embodiments may be discussed with reference to SAW resonators, the principles and advantages discussed herein can be applied to any suitable SAW device and/or any other suitable acoustic wave device. Embodiments will now be discussed with reference to drawings. Any suitable combination of features of the embodiments disclosed herein can be implemented together with each other.

FIG. 1A illustrates a cross section of a surface acoustic wave (SAW) resonator 1 according to an embodiment. The SAW resonator 1 can be referred to as a temperature compensated SAW (TCSAW) resonator. The SAW resonator 1 includes a piezoelectric layer 10, an IDT electrode 12 over the piezoelectric layer 10, a temperature compensation layer 14 over the IDT electrode 12, and a metal strip 16 buried in the temperature compensation layer 14. The illustrated metal strip 16 includes a high density metal strip layer 18 and an adhesion layer 20. Accordingly, the metal strip 16 is a multi-layer conductive strip. A multi-layer metal strip can include three or more layers in some other embodiments. The multi-layer metal strip 16 performs a mass loading function. Accordingly, the multi-layer metal strip 16 is an example of a multi-layer mass loading strip. The IDT electrode 12 includes fingers 22 and bus bars 24.

The piezoelectric layer 10 can be a piezoelectric substrate. The piezoelectric layer 10 can include any suitable piezoelectric layer, such as a lithium niobate (LN) layer or a lithium tantalate (LT) layer. A thickness of the piezoelectric layer 10 can be selected based on a wavelength A or L of a surface acoustic wave generated by the surface acoustic wave resonator 1. The IDT electrode 12 has a pitch that sets the wavelength A or L of the surface acoustic wave resonator 1. The piezoelectric layer 10 can be sufficiently thick to avoid significant frequency variation. In certain applications, the piezoelectric layer 10 can have a thickness in a range from about 30 micrometers to 600 micrometers. For example, the piezoelectric layer 10 can have a thickness in a range from about 100 micrometers to 200 micrometers in some applications.

The temperature compensation layer 14 can include any suitable material. For example, the temperature compensation layer 14 can be a silicon dioxide ($SiO_2$) layer. The temperature compensation layer 14 can be a layer of any other suitable material having a positive temperature coefficient of frequency. For instance, the temperature compensation layer 14 can be a tellurium dioxide ($TeO_2$) layer or a silicon oxyfluoride (SiOF) layer in certain applications. A temperature compensation layer can include any suitable combination of $SiO_2$, $TeO_2$, and/or SiOF.

The temperature compensation layer 14 can bring the temperature coefficient of frequency (TCF) of the SAW resonator 1 closer to zero relative to a similar SAW resonator without the temperature compensation layer 14. In certain applications, the temperature compensation layer 14 can improve the electromechanical coupling coefficient $k^2$ of the SAW resonator 1 relative to a similar SAW resonator without the temperature compensation layer 14. This advantage of the temperature compensation layer 14 can be more pronounced when the SAW resonator 1 includes an LN layer as the piezoelectric layer 10. The temperature compensation layer 14 has a thickness t1 measured from a lower surface 14a to an upper surface 14b opposite the lower surface 16a. In some embodiments, the thickness t1 of the temperature compensation layer 14 can be in a range from 0.1 L to 0.5 L. For example, when the wavelength L is 4 µm, the thickness t1 of the temperature compensation layer 14 can be 1200 nm.

Figure 2:
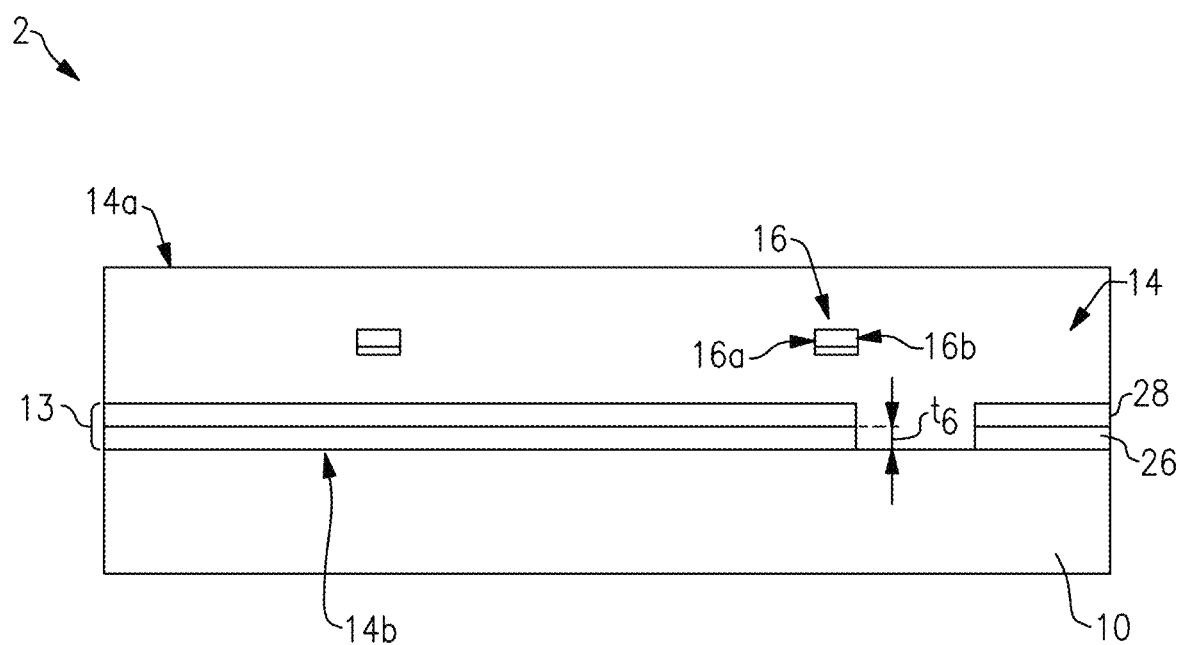
FIG. 2 illustrates a cross section of a surface acoustic wave resonator according to an embodiment.

The IDT electrode 12 can include any suitable material. For example, the IDT electrode can include molybdenum (Mo) in certain embodiments. The IDT electrode 12 can include a plurality of metal layers, for example, as shown in FIG. 2. The IDT electrode 12 may include one or more other metals, such as copper (Cu), Magnesium (Mg), tungsten (W), titanium (Ti), platinum (Pt), gold (Au), silver (Ag), iridium (Ir), ruthenium (Ru), etc. The IDT electrode 12 may include alloys, such as AlMgCu, AlCu, etc. The IDT electrode 12 has a thickness t2. In some embodiments, the thickness t2 of the IDT electrode 12 can be about 0.05 L. For example, when the wavelength L is 4 µm, the thickness t2 of the Mo layer 18 can be 200 nm.

FIG. 1B illustrates a top view of the SAW resonator 1 of FIG. 1A. The temperature compensation layer 14 is not illustrated to show the IDT electrode 12 and the metal strip 16. The dashed lines between FIGS. 1A and 1B show relative positions of the illustrated components. The illustrated SAW resonator 1 of FIGS. 1A and 1B includes two bus bars 24 and three fingers 22 extending from each of the bus bars 24. Each finger 22 has a proximate end 22a that is in contact with a bus bar 24 and a distal end 22b opposite the proximate end 22a. A body portion 22c of the finger 22 extends between the proximate end 22a and the distal end 22b. A portion near the distal end 22b can be referred as an edge portion. The edge portion (the distal end 22b) can be adjacent to and/or near the edge of the finger 22. In some embodiments, the edge portion can include the edge of the finger 22. In some other embodiments, the edge portion can offset from the edge of the finger 22 by about 0.1λ or less. With the edge portion offset from the edge of the finger 22 by 0.1λ, there can be no significant performance degradation.

FIG. 1C illustrates a side view of the metal strip 16 of FIG. 1A. The metal strip 16 includes the high density layer 18 and the adhesion layer 20. As illustrated, the high density layer 18 is disposed over the adhesion layer 20.

In certain applications, the high density metal strip layer 18 of the metal strip 16 can include any suitable metal that has a mass density that is equal to or greater than the mass density of the IDT electrode 12 or any suitable material that provides sufficient mass loading with a suitable dimension. For example, the high density metal strip layer 18 can include molybdenum (Mo), tungsten (W), gold (Au), silver (Ag), ruthenium (Ru), copper (Cu), platinum (Pt), iridium (Ir) or the like. Moreover, in some applications, a multi-layer mass loading strip can include a high density non-conductive layer in place of the high density metal strip layer 18. Such a high density non-conductive layer can be a heavy dielectric layer such as tantalum pentoxide ($Ta_2O_5$), tellurium dioxide ($TeO_2$), or the like dielectric material.

The adhesion layer 20 of the metal strip 16 can provide a better adhesion with the temperature compensation layer 14 than the adhesion between the high density metal strip layer 18 with the temperature compensation layer 14. For example, the adhesion layer 20 can include titanium (Ti), titanium nitride (TiN), aluminum nitride (AlN), tantalum pentoxide ($Ta_2O_5$), or the like. Some materials, such as Ti, for the adhesion layer 20 can improve a crystal orientation of the high density metal strip layer 18 than the metal strip 16 with different material for the adhesion layer 20 or without the adhesion layer 20. Accordingly, in certain applications, the adhesion layer 20 can be a titanium layer that provides desirable adhesion and desirable crystal orientation. The metal strip 16 may be formed in any suitable manner. For example, the adhesion layer 20 may be provided over the temperature compensation layer 14 by way of deposition. For example, the high density metal strip 18 may be provided over the adhesion layer 20 by way of deposition. An adhesion layer in a multi-layer mass loading strip can be non-conductive in certain applications.

The metal strip 16 has a thickness t3. The thickness t3 of the metal strip 16 can be the sum of a thickness t4 of the high density metal strip layer 18 and a thickness t5 of the adhesion layer 20. The thickness t4 of the high density metal strip layer 18 can be selected based on a wavelength A or L of a surface acoustic wave generated by the surface acoustic wave resonator 1. For example, the thickness t4 of the high density metal strip layer 18 can be in a range from 0.01 L to 0.03 L. The adhesion layer 20 can have any suitable thickness t5 that can provide an improved adhesion as compared to the metal strip 16 without the adhesion layer 20. For example, the thickness t5 can be less than 50 nm. Preferably, in order to provide an improved crystal orientation, the thickness t5 of the adhesion layer 20 can be in a range from 10 nm to 50 nm.

The metal strip 16 has an inner edge 16a and an outer edge 16b. The outer edge 16b of the metal strip 16 are illustrated to be aligned with the distal ends 22b of the fingers 22. However, in some embodiments, the outer edge 16b can be anywhere between the distal end 22b of the finger 22 that extends from the bus bar 24 and the bus bar 24. In some other embodiments, the outer edge 16b may overlap with the bus bar 24 or be outside of the IDT electrode 12.

FIG. 1D illustrates a cross section of a surface acoustic wave (SAW) resonator 1' according to an embodiment. The SAW resonator 1' includes a piezoelectric layer 10, an IDT electrode 12 over the piezoelectric layer 10, a temperature compensation layer 14 over the IDT electrode 12, and a metal strip 16' buried in the temperature compensation layer 14. FIG. 1E illustrates a top view of the SAW resonator 1' of FIG. 1D. FIG. 1F illustrates a side view of the metal strip 16' of FIG. 1D. The SAW resonator 1' is generally similar to the SAW resonator 1 illustrated in FIGS. 1A to 1C, except that the metal strip 16' of the SAW resonator 1' includes three layers. A multi-layer metal strip in accordance with the principles and advantages disclosed herein can include more than three layers in some other embodiments.

As illustrated in FIG. 1F, the metal strip 16' includes a first layer (e.g., an adhesion layer 20), a second layer (e.g., a high density metal strip layer 18), and a third layer 19. The third layer 19 can be a second adhesion layer. This can provide a better adhesion with the temperature compensation layer 14 than the adhesion between the high density metal strip layer 18 with the temperature compensation layer 14. The second adhesion layer can be a titanium layer. In certain instances, the adhesion layer 20 and the second adhesion layer 19 can be of the same material. For example, the metal strip 16' can be a titanium/high density metal/titanium strip. The second adhesion layer can include titanium nitride (TiN), aluminum nitride (AlN), tantalum pentoxide ($Ta_2O_5$), or the like in some other instances.

FIG. 1G illustrates a cross section of a SAW resonator 1" according to another embodiment. The SAW resonator 1" is like the SAW resonator 1 of FIG. 1A except that the SAW resonator 1" additionally includes a support substrate 21 on a side of the piezoelectric layer 10 that is opposite to the IDT electrode structure 12. FIG. 1G illustrates that a metal strip 16 can be implemented in a SAW resonator with a multi-layer piezoelectric substrate. In certain applications, the piezoelectric layer 21 can have a thickness of less than the pitch A of the IDT electrode 12 in the SAW resonator 1" Such a piezoelectric layer can have a thickness in a range from about 0.1λ to 1λ. For example, the piezoelectric layer 21 can have a thickness in a range from about 0.1λ to 0.4λ. In some other applications, the piezoelectric layer 21 can have a thickness in a range from about 1λ to 40λ of the pitch A of IDT electrode 12 in the SAW resonator 1". In certain instances, the thickness of the piezoelectric layer 21 can be in a range from 0.1 micrometer to 30 micrometers.

The support substrate 21 can be any suitable substrate layer, such as a silicon layer, a quartz layer, a ceramic layer, a glass layer, a spinel layer, a magnesium oxide spinel layer, a sapphire layer, a diamond layer, a silicon carbide layer, a silicon nitride layer, an aluminum nitride layer, or the like. As one example, the SAW resonator 1" can include a lithium niobate/silicon piezoelectric substrate in certain applications.

The support substrate 21 can have a relatively high acoustic impedance. An acoustic impedance of the support substrate 21 can be higher than an acoustic impedance of the piezoelectric layer 10. For instance, the support substrate 21 can have a higher acoustic impedance than an acoustic impedance of lithium niobate and a higher acoustic impedance than lithium tantalate. The acoustic impedance of the support substrate 21 can be higher than an acoustic impedance of the temperature compensation layer 21. The SAW resonator 1″ including the piezoelectric layer 10 on a support substrate 21 with relatively high thermal conductivity, such as silicon substrate, can achieve better thermal dissipation compared to a similar SAW resonator without the high impedance support substrate 21.

In certain embodiments, a SAW resonator can include two or more layers on the side of the piezoelectric layer 10 that is opposite to the IDT electrode 12. In some embodiments, there can be an additional layer between the piezoelectric layer 10 and the support substrate 21. The additional layer can be a low impedance layer that has a lower acoustic impedance than the support substrate 12. In some embodiments, the additional layer can be a silicon dioxide (SiO2) layer. The additional layer can increase adhesion between layers of the multi-layer piezoelectric substrate. In such applications, the additional layer can be referred to as an adhesion layer. Alternatively or additionally, the additional layer can increase heat dissipation in the SAW resonator relative to the SAW resonator 1, 1″. In such applications, the additional layer can be referred to as a heat dissipation layer. The additional layer can reduce back reflection of the support substrate in certain applications. In such applications, the additional layer can scatter back reflections by beam scattering. In some instances, the additional layer can be a polycrystalline spinel layer and the support substrate 12 can be a silicon layer.

In some other embodiments, a multi-layer mass loading strip can include two or more layers of high density metal. The high density metal layers can be of different high density material. Example high density metals include molybdenum (Mo), tungsten (W), gold (Au), silver (Ag), ruthenium (Ru), copper (Cu), platinum (Pt), iridium (Ir) or the like.

FIG. 1H illustrates a cross section of a surface acoustic wave (SAW) resonator 1‴ according to an embodiment. FIG. 1I illustrates a top view of the SAW resonator 1‴ of FIG. 1H along the line 1H-1H in FIG. 1I. The SAW resonator 1‴ of FIGS. 1H and 1I is like the SAW resonator 1 of FIGS. 1A and 1B, except that the metal strip 16 of the SAW resonator 1‴ is offset or shifted by a displacement distance d. Even through the metal strip 16 is shifted in the SAW resonator 1‴, the metal strip 16 overlaps the edge portions of fingers 22 in the SAW resonator 1‴. FIGS. 1H and 1I illustrate that a mass loading strip can overlap the edge portions of fingers of an IDT electrode in cases where the fingers 22 extend a relatively small amount beyond the mass loading strip.

As illustrated, the metal strip 16 can be positioned over edge portion near the distal portion 22b of a finger 22. In some applications, the displacement distanced can be up to 0.1λ. For example, the displacement d can be in a range from 0.01λ to 0.1λ. In some applications, the displacement d can be up to 400 nm. For example, the displacement d can be in a range from 10 nm to 400 nm. With such displacements, the performance of the SAW resonator 1‴ should not be significantly degraded relative to the SAW resonator 1.

FIG. 2 illustrates a cross section of a surface acoustic wave (SAW) resonator 2 according to an embodiment. The resonator 2 illustrated in FIG. 2 is generally similar to the resonator 1 illustrated in FIG. 1A. However, unlike the IDT electrode 12 of the resonator 1 illustrated in FIG. 1A, the IDT electrode 13 of the resonator 2 illustrated in FIG. 2 includes a plurality of conductive layers. As illustrated, the IDT electrode of the resonator 2 includes a molybdenum (Mo) layer 26 and an aluminum (Al) layer 28. The Mo layer 26 of the IDT electrode 13 has a thickness t6. In some embodiments, the thickness t6 of the Mo layer 26 can be about 0.05 L. For example, when the wavelength L is 4 μm, the thickness t6 of the Mo layer 26 can be 200 nm.

Figure 3:
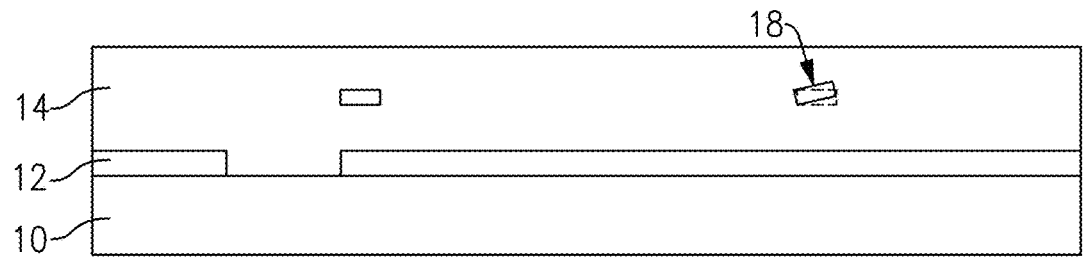
FIG. 3 illustrates a cross section of a surface acoustic wave resonator with a delaminated metal strip.

FIG. 3 illustrates a cross section of a surface acoustic wave (SAW) resonator 3 according to an embodiment. The resonator 3 illustrated in FIG. 3 is generally similar to the resonator 1 illustrated in FIG. 1A. However, unlike the metal strip 16 of the resonator 1 that includes the high density metal strip layer 18 and the adhesion layer 20, the metal strip of the SAW resonator 3 includes only the high density metal strip layer 18. FIG. 3 illustrates a delamination of the high density metal strip layer 18. This can be due to a relatively weak adhesion between the high density metal strip layer 18 and the temperature compensation layer 14. The delamination of the high density metal strip layer 18 can cause transverse modes.

Figure 4A:
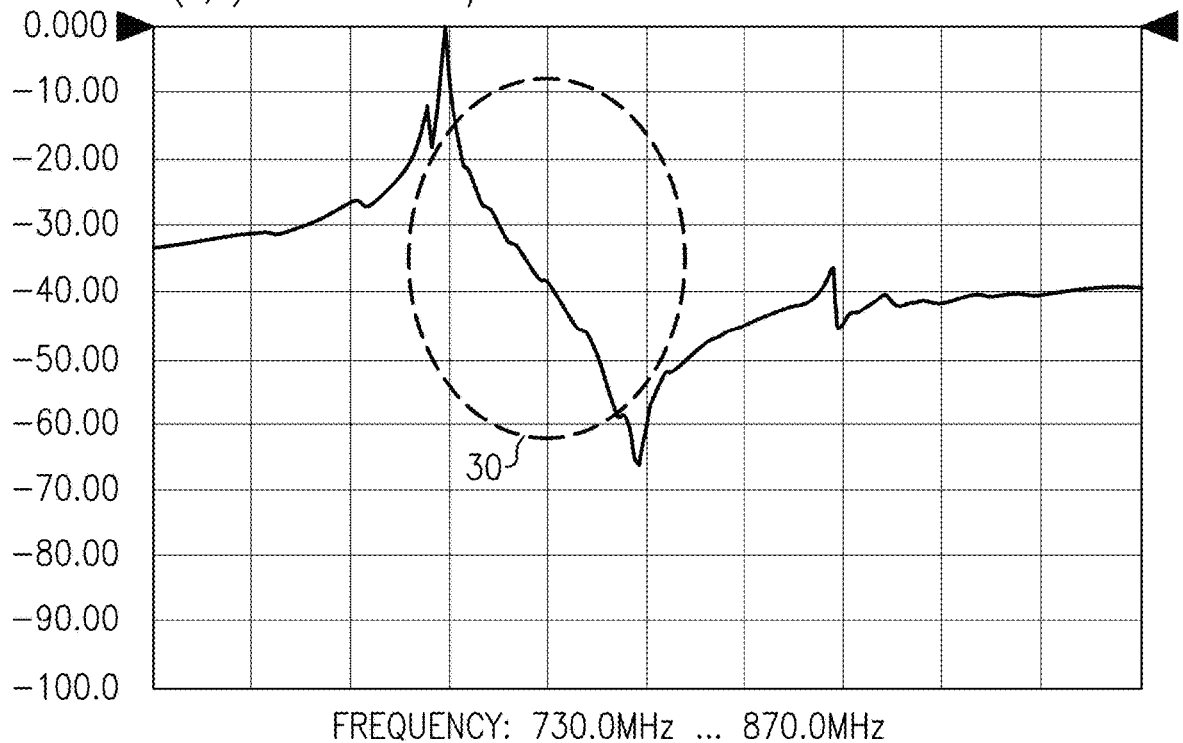
FIG. 4A is a graph showing a measurement of an admittance of the resonator of FIG. 3.
Figure 4B:
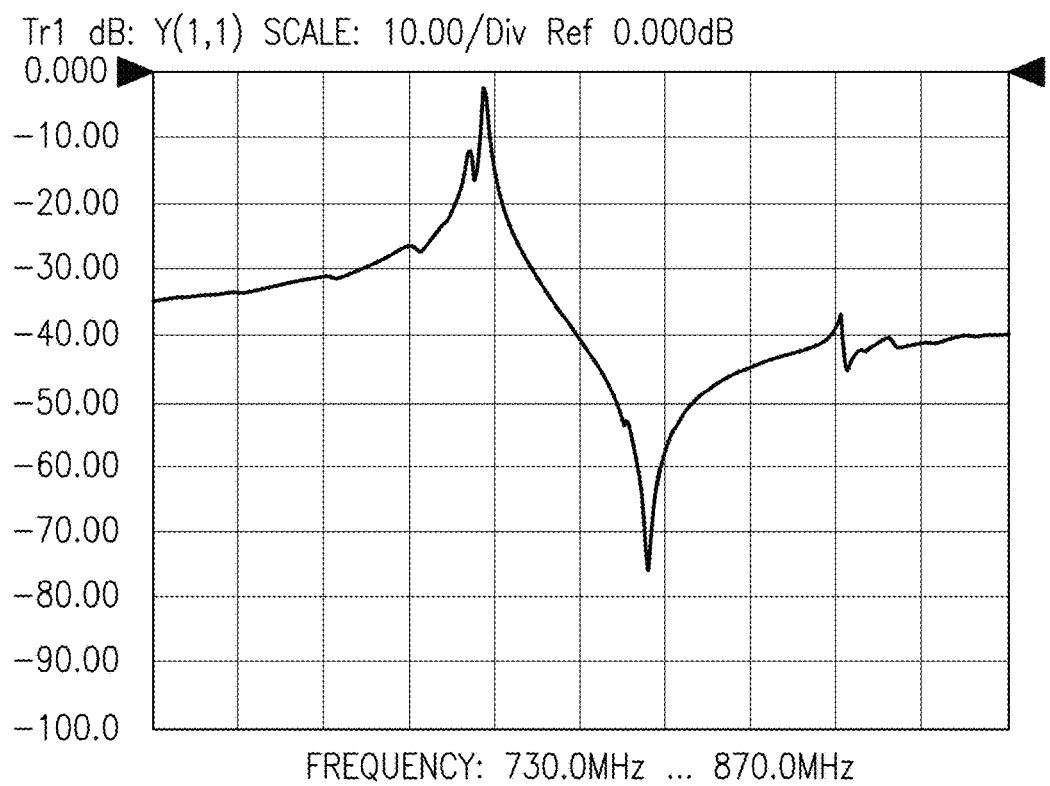
FIG. 4B is a graph showing a measurement of an admittance of the resonator of FIG. 3 without a metal strip being delaminated.

FIG. 4A is a graph showing a measurement of admittance of the SAW resonator 3 of FIG. 3. FIG. 4B is a graph showing a measurement of admittance of a resonator similar to the SAW resonator 3 illustrated in FIG. 3 without the metal strip layer 18 being delaminated. The graph can indicate that the metal strip layer 18, when not delaminated, can suppress transverse modes. On the other hand, transverse modes near and between resonance and anti-resonance (e.g., in a region 30) are observed in FIG. 4A. This can be due to the delamination of the high density metal strip layer 18 illustrated in FIG. 3. Accordingly, such delamination can provide an undesirable frequency response for the SAW resonator 3.

Figure 4C:
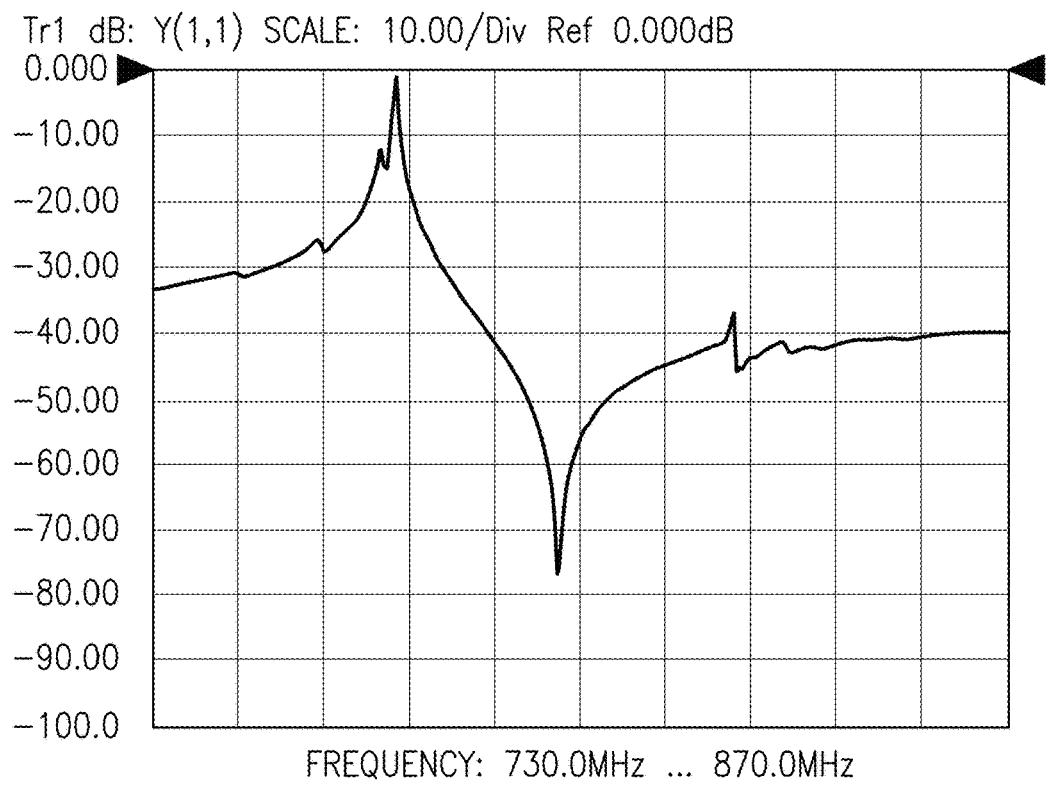
FIG. 4C is a graph showing a measurement of an admittance of the resonator of FIG. 1A.

FIG. 4C is a graph showing a measurement of admittance of the SAW resonator 1 of FIG. 1A. The graph can indicate that the metal strip 16 can suppress transverse mode as much as or more than the metal strip layer 18. Therefore, the metal strip 16 can provide transverse suppression while having a relatively strong adhesion with the temperature compensation layer 14.

Figure 5:
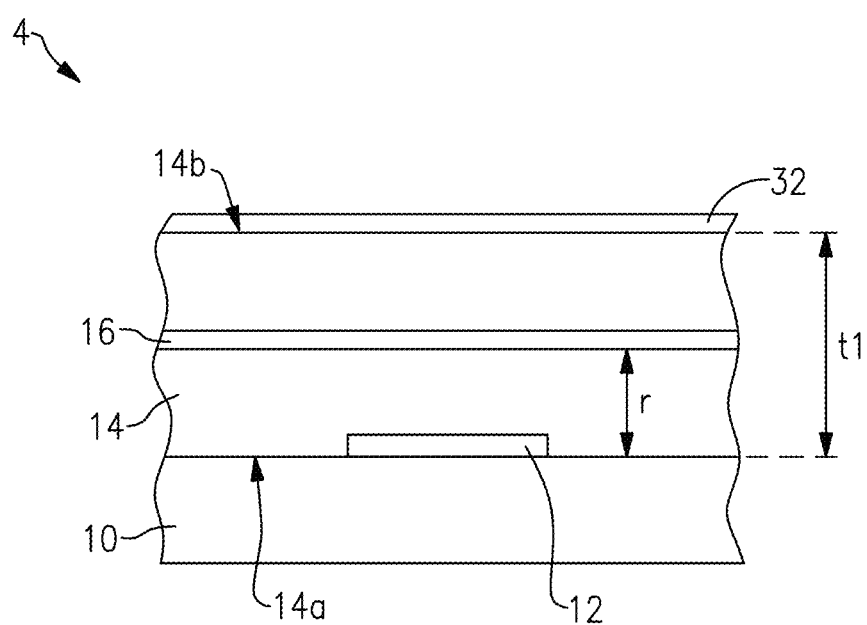
FIG. 5 illustrates a cross section of a portion of a surface acoustic wave resonator according to an embodiment.

FIG. 5 illustrates a cross section of a portion of a surface acoustic wave (SAW) resonator 4 according to an embodiment. The resonator 4 illustrated in FIG. 5 is generally similar to the resonator 1 illustrated in FIG. 1A. However, unlike the resonator 1 illustrated in FIG. 1A, the resonator 4 includes a silicon nitride (SiN) layer 32 over the temperature compensation layer 14. The SiN layer 32 can be disposed entirely or partially over an upper surface 14b of the temperature compensation layer 14. In some instances, an IDT electrode can include fingers having the SiN layer 32 over a central portion of an active region and border regions free from SiN. The SiN layer 32 can cause a magnitude of the velocity in the underlying region of the SAW resonator 4 to be increased. In certain applications, another suitable material can be implemented in place of the SiN layer 32 to increase the magnitude of the velocity of the underlying region of the SAW resonator 4.

As with the resonators 1 and 2 illustrated in FIGS. 1A and 2, respectively, the metal strip 16 can include a plurality of layers, such as, a high density metal strip layer and an adhesion layer. The metal strip 16 can be disposed at any suitable position that is a distance r from the piezoelectric layer 10 (or from the lower surface 14a of the temperature compensation layer 14). The distance r may be selected relative to the thickness t1 of the temperature compensation layer 14. For example, the distance r can be in a range from 0.2×t1 to 0.8×t1 in some embodiments, in which t1 is the thickness of the temperature compensation layer 14. When the SiN layer 32 is disposed over the temperature compensation layer 14, it may be preferable for the distance r to be in a range from 0.4×t1 to 0.6×t1.

Figure 6:
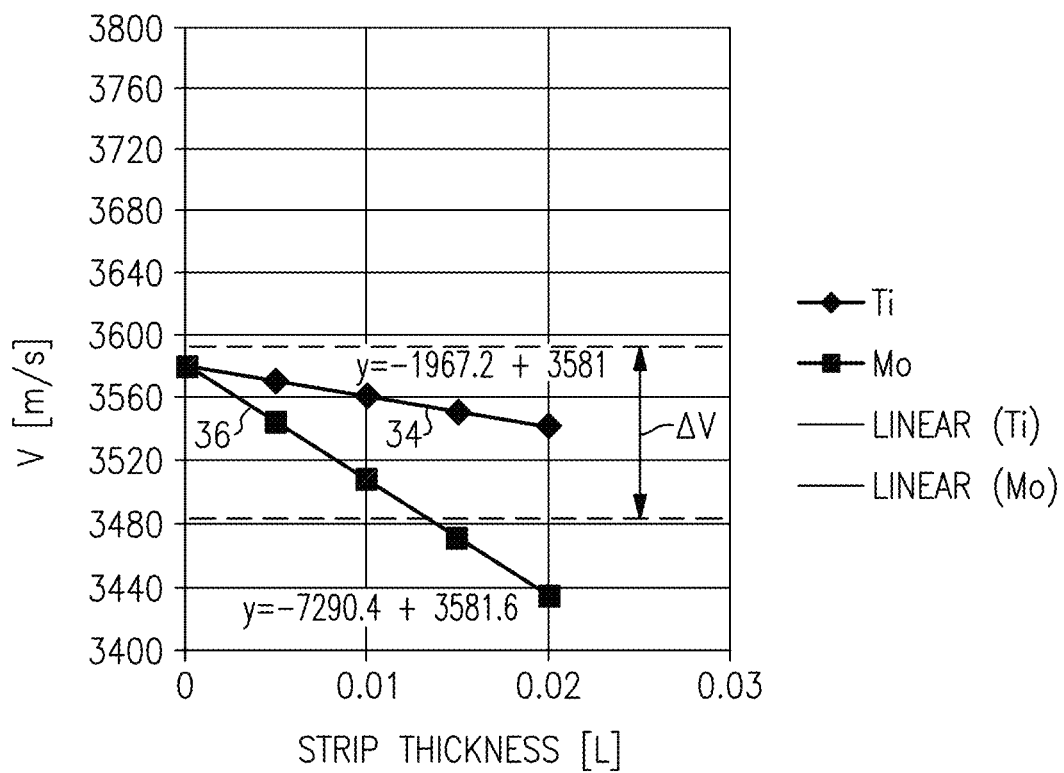
FIG. 6 is a graph showing simulated velocities of a surface acoustic wave in surface acoustic wave resonators.

FIG. 6 is a graph showing simulated velocities of a surface acoustic wave in surface acoustic wave (SAW) resonators. First simulation results 34 are for the resonator with a metal strip that includes only Ti (Ti metal strip) and second simulation results 36 are for the resonator with a metal strip that includes only Mo (Mo metal strip). As shown in FIG. 6, Ti provides less mass loading than Mo for the same thickness. For example, a specified mass loading ΔV for a piston operation may be about 105 m/s. The resonator with the Mo metal strip having a thickness about 0.015 L can obtain the specified mass loading ΔV of 105 m/s. However, at the same thickness, the resonator with the Ti metal strip obtains a mass loading of about 25 m/s. For the piston mode operation to suppress the transverse mode efficiently, the specified mass loading ΔV is preferably set in a range from 40 m/s to 120 m/s. In order to obtain the specified mass loading ΔV, the thickness of the Ti metal strip should be thicker (e.g., about 3.7 times thicker) than the Mo metal strip. Fabricating a relatively thick Ti metal strip can be challenging. Therefore, it can be beneficial to use the Mo in the metal strip for mass loading.

The mass loading strips disclosed herein can be implemented together with a piston mode structure of an IDT electrode and/or with an overlying layer arranged to adjust acoustic velocity in an underlying region of an acoustic wave device.

FIG. 7A illustrates a cross section of a surface acoustic wave (SAW) resonator 5 according to an embodiment. The SAW resonator 5 includes a piezoelectric layer 10, an IDT electrode 12' over the piezoelectric layer 10, a temperature compensation layer 14 over the IDT electrode 12', and a metal strip 16 buried in the temperature compensation layer 14.

FIG. 7B illustrates a top view of the SAW resonator 5 of FIG. 7A. Each finger 22' has a proximate end 22a' that is in contact with a bus bar 24 and a distal end 22b' opposite the proximate end 22a'. A body portion 22c' of the finger 22' extends between the proximate end 22a' and the distal end 22b'. A portion near the distal end 22b' can be referred as an edge portion. The SAW resonator 5 is generally similar to the SAW resonator 1 illustrated in FIGS. 1A to 1C, except that the distal ends 22b' of the fingers of the IDT electrode 12' of the SAW resonator 5 have a hammer head shape. The hammer head distal end 22b' can provide a velocity difference between the border region and a central part of the active region, thereby facilitating the piston mode operation.

FIG. 8A illustrates a cross section of a surface acoustic wave (SAW) resonator 6 according to an embodiment. The SAW resonator 6 includes a piezoelectric layer 10, an IDT electrode 12" over the piezoelectric layer 10, a temperature compensation layer 14 over the IDT electrode 12", and a metal strip 16 buried in the temperature compensation layer 14.

FIG. 8B illustrates a top view of the SAW resonator 6 of FIG. 8A. Each finger 22" has a proximate end 22a" that is in contact with a bus bar 24 and a distal end 22b" opposite the proximate end 22a". A body portion 22c" of the finger 22" extends between the proximate end 22a" and the distal end 22b". A portion near the distal end 22b" can be referred as an edge portion. The SAW resonator 6 is generally similar to the SAW resonator 5 illustrated in FIGS. 7A and 7B, except that the body portion 22c" of fingers of the IDT electrode 12" of the SAW resonator 6 has a widened portion 40. The widened portion 40 can provide a velocity difference between the border region and a central part of the active region, thereby facilitating the piston mode operation.

FIG. 9A illustrates a cross section of a surface acoustic wave (SAW) resonator 7 according to an embodiment. The SAW resonator 7 includes a piezoelectric layer 10, an IDT electrode 12''' over the piezoelectric layer 10, a temperature compensation layer 14 over the IDT electrode 12''', and a metal strip 16 buried in the temperature compensation layer 14.

FIG. 9B illustrates a top view of the SAW resonator 6 of FIG. 9A. The SAW resonator 7 is generally similar to the SAW resonator 5 illustrated in FIGS. 7A and 7B, except that the bus bar 24' of the IDT electrode 12''' of the SAW resonator 7 includes an extension portion 42. The extension portion 42 can provide a velocity difference between the border region and a central part of the active region, thereby facilitating the piston mode operation.

FIG. 10A illustrates a cross section of a surface acoustic wave (SAW) resonator 8 according to an embodiment. The SAW resonator 8 includes a piezoelectric layer 10, an IDT electrode 12'''' over the piezoelectric layer 10, a temperature compensation layer 14 over the IDT electrode 12'''', and a metal strip 16 buried in the temperature compensation layer 14.

FIG. 10B illustrates a top view of the SAW resonator 6 of FIG. 10A. The SAW resonator 8 is generally similar to the SAW resonator 7 illustrated in FIGS. 9A and 9B, except that the IDT electrode 12'''' of the SAW resonator 8 includes a widened portion 44. The widened portion 44 can provide a velocity difference between the border region and a central part of the active region, thereby facilitating the piston mode operation.

FIG. 11A illustrates a cross section of a surface acoustic wave (SAW) resonator 9 according to an embodiment. The SAW resonator 9 includes a piezoelectric layer 10, an IDT electrode 12 over the piezoelectric layer 10, a temperature compensation layer 14 over the IDT electrode 12', a metal strip 16 buried in the temperature compensation layer 14, and a passivation layer 46 over the temperature compensation layer 14.

FIG. 11B illustrates a top view of the SAW resonator 9 of FIG. 11A. The SAW resonator 9 is generally similar to the SAW resonator 1 illustrated in FIGS. 1A to 1C, except that the SAW resonator 9 includes the passivation layer 46.

The illustrated passivation layer 46 is disposed entirely over an upper surface of the temperature compensation layer 14 in the illustrated cross section. However, the passivation layer 46 can be disposed partially over the upper surface of the temperature compensation layer 14 with one or more trenches, in some other instances. In some embodiments, the passivation layer 46 can be a dispersion adjustment layer. The dispersion adjustment layer can cause a magnitude of the velocity in the underlying region of the SAW resonator 9 to be increased. In certain applications, the passivation layer 46 can include any suitable material to increase the magnitude of the velocity of the underlying region of the SAW resonator 9. According in some applications, the passivation layer 46 can include silicon nitride (SiN). In some embodiments, the passivation layer 46 can be patterned such that the acoustic propagation velocity can be adjusted at certain regions of the SAW resonator 9. For example, the passivation layer 46 can have a trench. The trench can be positioned over the conductive strip in certain embodiments to decrease acoustic velocity in a border region to thereby provide transverse mode suppression.

FIG. 12A illustrates a cross section of a surface acoustic wave (SAW) resonator 11 according to an embodiment. The SAW resonator 11 includes a piezoelectric layer 10, an IDT electrode 12 over the piezoelectric layer 10, a temperature compensation layer 14 over the IDT electrode 12, and a metal strip 16 disposed on the temperature compensation layer 14.

FIG. 12B illustrates a top view of the SAW resonator 11 of FIG. 12A. The SAW resonator 11 is generally similar to the SAW resonator 1 illustrated in FIGS. 1A to 1C, except that the metal strip 16 of the SAW resonator 9 is disposed on the temperature compensation layer 14. In some manufacturing processes, it can be easier to manufacture a SAW resonator that has a metal strip 16 on top of the temperature compensation layer than having the metal strip embedded in the temperature compensation layer.

Figure 13A:
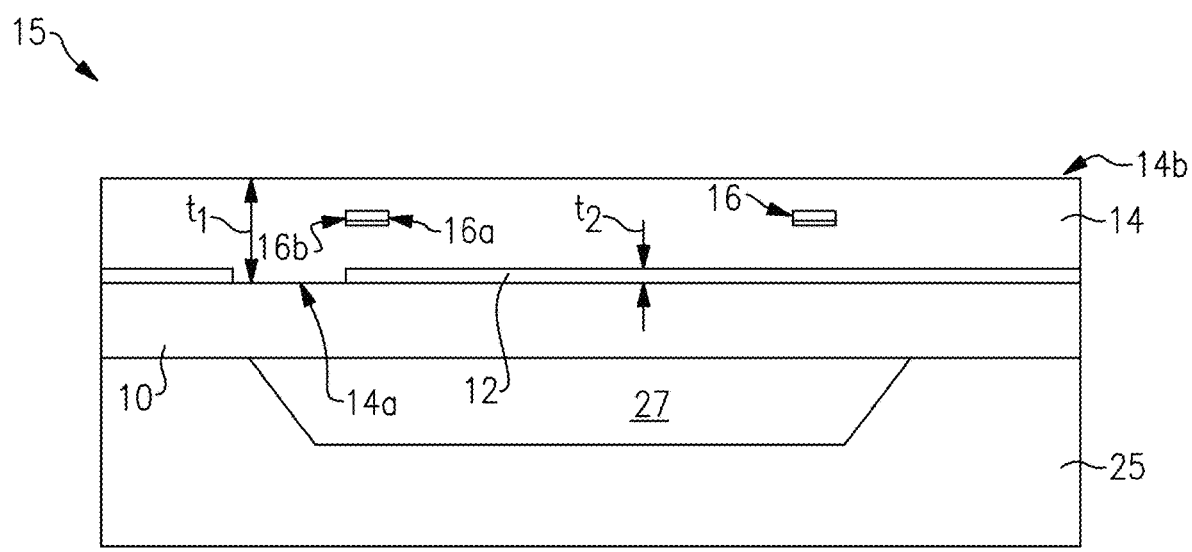
FIG. 13A illustrates a cross section of a Lamb wave device according to an embodiment.

FIG. 13A illustrates a cross section of a Lamb wave device 15 according to an embodiment. The Lamb wave device 15 can be a Lamb wave resonator. The Lamb wave device 15 includes a piezoelectric layer 10, an IDT electrode 12 over the piezoelectric layer 10, a temperature compensation layer 14 over the IDT electrode 12, and a metal strip 16 buried in the temperature compensation layer 14. The illustrated metal strip 16 includes a high density metal strip layer 18 and an adhesion layer 20. Accordingly, the metal strip 16 is a multi-layer conductive strip. A multi-layer metal strip can include three or more layers in some other embodiments. The multi-layer metal strip 16 performs a mass loading function. Accordingly, the multi-layer metal strip 16 is an example of a multi-layer mass loading strip. The Lamb wave device 15 also includes a substrate 25, and an air cavity 27 formed between the piezoelectric layer 10 and the substrate 25. The substrate 25 can include any suitable material. For example, the substrate 25 can be a semiconductor substrate, such as a silicon substrate.

Figure 13B:
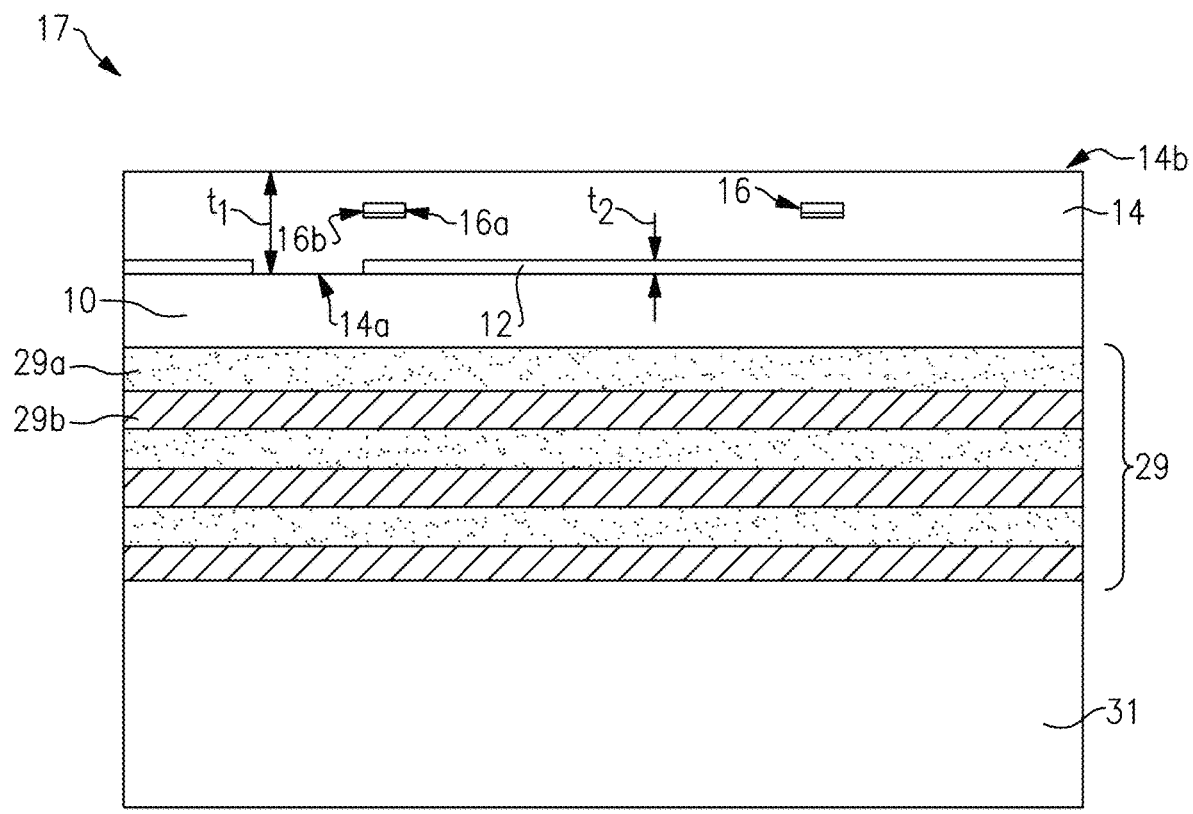
FIG. 13B illustrates a cross section of a Lamb wave device according to another embodiment.

FIG. 13B illustrates a cross section of a Lamb wave device 17 according to another embodiment. The Lamb wave device 17 can be a Lamb wave resonator. The Lamb wave device 17 is like the Lamb wave device 15 of FIG. 13A except that the Lamb wave device 17 includes a solid acoustic mirror 29 and a substrate 31 in place of the substrate 25 and the cavity 27. The solid acoustic mirror 29 can include Bragg reflectors. For instance, the solid acoustic mirror 29 can include alternating layers of a low impedance layer 29a and a high impedance layer 29b. As one example, the low impedance layer can be a silicon dioxide layer and the high impedance layer can be a tungsten layer. The substrate 31 can include any suitable material. For example, the substrate 31 can be a semiconductor substrate, such as a silicon substrate.

A method of manufacturing an acoustic wave resonator according to an embodiment will now be described. The method can include providing an acoustic wave resonator with a temperature compensation layer over an interdigital transducer electrode. The interdigital transducer electrode includes fingers extending from a bus bar. The fingers each include an edge portion and a body portion. The method includes forming a first layer of a mass loading strip that overlaps with the edge portions of the fingers of the interdigital transducer electrode. Material of the temperature compensation layer is positioned between the first layer of the mass loading strip and the interdigital transducer electrode. The method also includes depositing a second layer of the mass loading strip over the first layer of the mass loading strip. The first layer of the mass loading strip has a higher adhesion than the second layer of the mass loading strip. The second layer of the mass loading strip has a higher mass than the first layer of the mass loading strip.

A method of filtering a radio frequency signal according to an embodiment will now be described. The method includes receiving a radio frequency signal at an input port of an acoustic wave filter that includes an acoustic wave resonator. The acoustic wave resonator includes a multi-layer mass loading strip that overlaps edge portions of fingers of an interdigital transducer electrode. The method also includes filtering the radio frequency signal with the acoustic wave filter. The filtering includes suppressing a transverse mode using the multi-layer mass loading strip of the acoustic wave resonator. The filtering can be performed, for example, with the transmit filter 45 of FIG. 14A or the receive filter 50 of FIG. 14B.

A SAW device including any suitable combination of features disclosed herein be included in a filter arranged to filter a radio frequency signal in a fifth generation (5G) New Radio (NR) operating band within Frequency Range 1 (FR1). A filter arranged to filter a radio frequency signal in a 5G NR operating band can include one or more SAW devices disclosed herein. FR1 can be from 410 MHz to 7.125 GHz, for example, as specified in a current 5G NR specification. One or more SAW devices in accordance with any suitable principles and advantages disclosed herein can be included in a filter arranged to filter a radio frequency signal in a 4G LTE operating band and/or in a filter having a passband that includes a 4G LTE operating band and a 5G NR operating band.

FIG. 14A is a schematic diagram of an example transmit filter 45 that includes surface acoustic wave resonators of a surface acoustic wave component according to an embodiment. The transmit filter 45 can be a band pass filter. The illustrated transmit filter 45 is arranged to filter a radio frequency signal received at a transmit port TX and provide a filtered output signal to an antenna port ANT. The transmit filter 45 includes series SAW resonators TS1, TS2, TS3, TS4, TS5, TS6, and TS7, shunt SAW resonators TP1, TP2, TP3, TP4, and TP5, series input inductor L1, and shunt inductor L2. Some or all of the SAW resonators TS1 to TS7 and/or TP1 to TP5 can be a SAW resonators with a multi-layer mass loading strip for transverse mode suppression in accordance with any suitable principles and advantages disclosed herein. For instance, one or more of the SAW resonators of the transmit filter 45 can be a surface acoustic wave resonator 1 of FIGS. 1A to 1C. Alternatively or additionally, one or more of the SAW resonators of the transmit filter 45 can be a surface acoustic wave resonator 2 of FIG. 2 and/or a surface acoustic wave resonator 4 of FIG. 5. Any suitable number of series SAW resonators and shunt SAW resonators can be included in a transmit filter 45.

FIG. 14B is a schematic diagram of a receive filter 50 that includes surface acoustic wave resonators of a surface acoustic wave component according to an embodiment. The receive filter 50 can be a band pass filter. The illustrated receive filter 50 is arranged to filter a radio frequency signal received at an antenna port ANT and provide a filtered output signal to a receive port RX. The receive filter 50 includes series SAW resonators RS1, RS2, RS3, RS4, RS5, RS6, RS7, and RS7, shunt SAW resonators RP1, RP2, RP3, RP4, and RP5, and RP6, shunt inductor L2, and series output inductor L3. Some or all of the SAW resonators RS1 to RS8 and/or RP1 to RP6 can be SAW resonators with a multi-layer mass loading strip for transverse mode suppression in accordance with any suitable principles and advantages disclosed herein. For instance, one or more of the SAW resonators of the receive filter 50 can be a surface acoustic wave resonator 1 of FIGS. 1A to 1C. Alternatively or additionally, one or more of the SAW resonators of the receive filter 50 can be a surface acoustic wave resonator 2 of FIG. 2 and/or a surface acoustic wave resonator 4 of FIG. 5. Any suitable number of series SAW resonators and shunt SAW resonators can be included in a receive filter 50.

Figure 15:
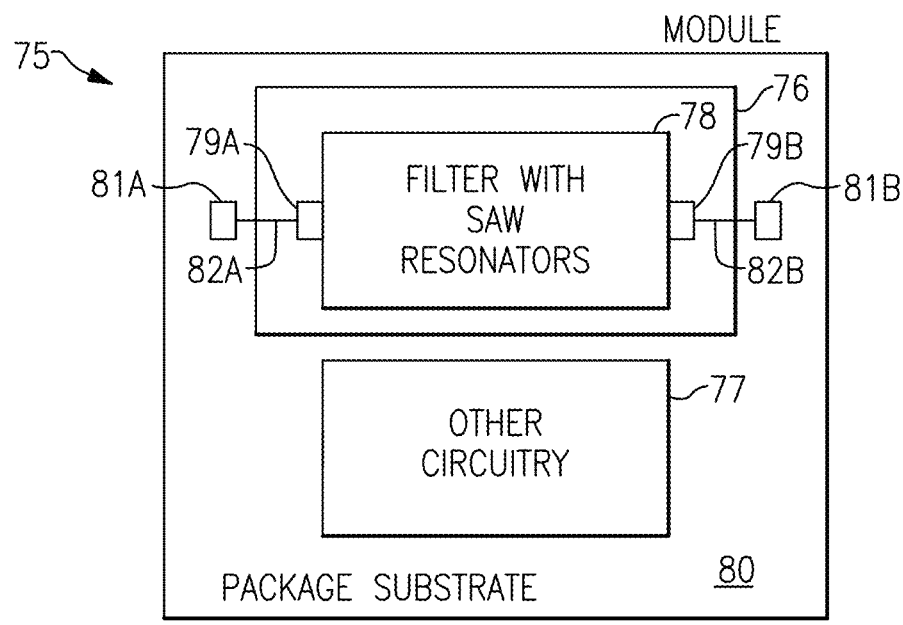
FIG. 15 is a schematic diagram of a radio frequency module that includes a surface acoustic wave component according to an embodiment.

FIG. 15 is a schematic diagram of a radio frequency module 75 that includes a surface acoustic wave component 76 according to an embodiment. The illustrated radio frequency module 75 includes the SAW component 76 and other circuitry 77. The SAW component 76 can include one or more SAW devices with any suitable combination of features of the SAW devices disclosed herein. Such SAW devices can include one or more SAW resonators, one or more SAW delay lines, one or more multi-mode SAW filters, or any suitable combination thereof. The SAW component 76 can include a SAW die that includes SAW resonators.

The SAW component 76 shown in FIG. 15 includes a filter 78 and terminals 79A and 79B. The filter 78 includes SAW resonators. One or more of the SAW resonators can be implemented in accordance with any suitable principles and advantages of the surface acoustic wave resonator 1 of FIGS. 1A to 1C, the surface acoustic wave resonator 2 of FIG. 2 and/or a surface acoustic wave resonator 4 of FIG. 5. The filter 78 can be a TC-SAW filter arranged as a band pass filter to filter radio frequency signals with frequencies below about 3.5 GHz in certain applications. The terminals 79A and 78B can serve, for example, as an input contact and an output contact. The SAW component 76 and the other circuitry 77 are on a common packaging substrate 80 in FIG. 15. The package substrate 80 can be a laminate substrate. The terminals 79A and 79B can be electrically connected to contacts 81A and 81B, respectively, on the packaging substrate 80 by way of electrical connectors 82A and 82B, respectively. The electrical connectors 82A and 82B can be bumps or wire bonds, for example. The other circuitry 77 can include any suitable additional circuitry. For example, the other circuitry can include one or more power amplifiers, one or more radio frequency switches, one or more additional filters, one or more low noise amplifiers, the like, or any suitable combination thereof. The radio frequency module 75 can include one or more packaging structures to, for example, provide protection and/or facilitate easier handling of the radio frequency module 75. Such a packaging structure can include an overmold structure formed over the packaging substrate 75. The overmold structure can encapsulate some or all of the components of the radio frequency module 75.

Figure 16:
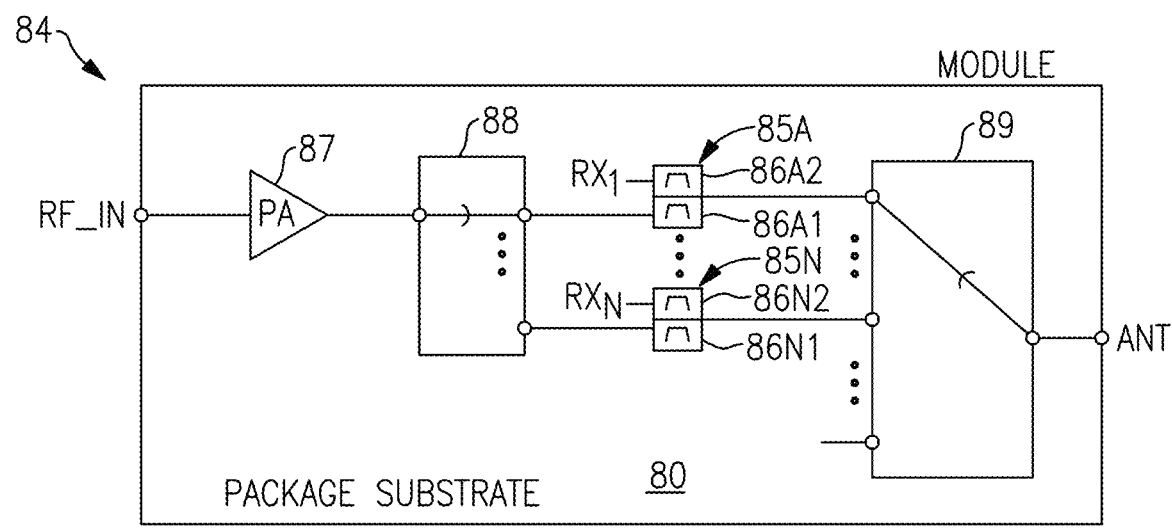
FIG. 16 is a schematic diagram of a radio frequency module that includes a surface acoustic wave component according to an embodiment.

FIG. 16 is a schematic diagram of a radio frequency module 84 that includes a surface acoustic wave component according to an embodiment. As illustrated, the radio frequency module 84 includes duplexers 85A to 85N that include respective transmit filters 86A1 to 86N1 and respective receive filters 86A2 to 86N2, a power amplifier 87, a select switch 88, and an antenna switch 89. The radio frequency module 84 can include a package that encloses the illustrated elements. The illustrated elements can be disposed on a common packaging substrate 80. The packaging substrate can be a laminate substrate, for example.

The duplexers 85A to 85N can each include two acoustic wave filters coupled to a common node. The two acoustic wave filters can be a transmit filter and a receive filter. As illustrated, the transmit filter and the receive filter can each be band pass filters arranged to filter a radio frequency signal. One or more of the transmit filters 86A1 to 86N1 can include one or more SAW resonators in accordance with any suitable principles and advantages disclosed herein. Similarly, one or more of the receive filters 86A2 to 86N2 can include one or more SAW resonators in accordance with any suitable principles and advantages disclosed herein. Although FIG. 16 illustrates duplexers, any suitable principles and advantages disclosed herein can be implemented in other multiplexers (e.g., quadplexers, hexaplexers, octoplexers, etc.) and/or in switch-plexers.

The power amplifier 87 can amplify a radio frequency signal. The illustrated switch 88 is a multi-throw radio frequency switch. The switch 88 can electrically couple an output of the power amplifier 87 to a selected transmit filter of the transmit filters 86A1 to 86N1. In some instances, the switch 88 can electrically connect the output of the power amplifier 87 to more than one of the transmit filters 86A1 to 86N1. The antenna switch 89 can selectively couple a signal from one or more of the duplexers 85A to 85N to an antenna port ANT. The duplexers 85A to 85N can be associated with different frequency bands and/or different modes of operation (e.g., different power modes, different signaling modes, etc.).

Figure 17A:
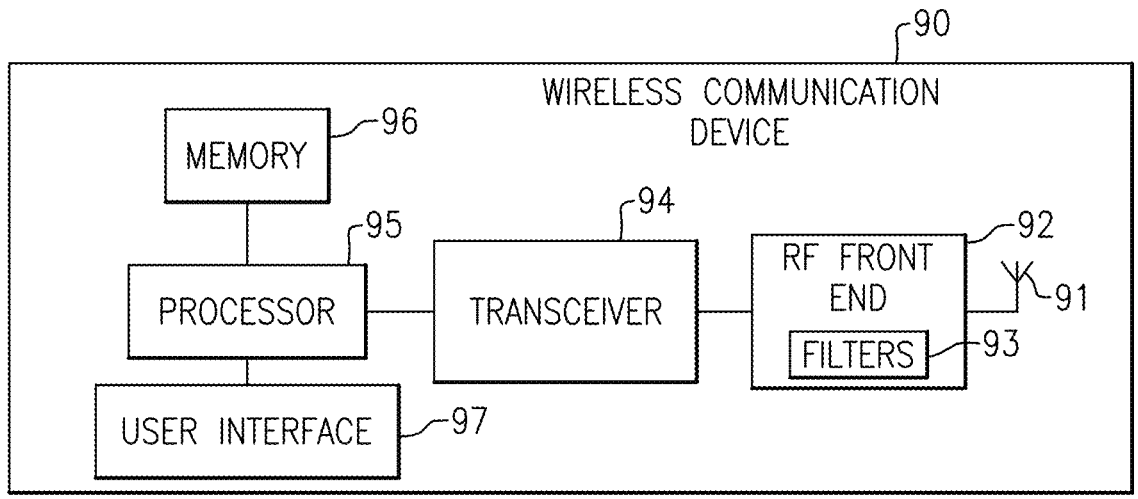
FIG. 17A is a schematic block diagram of a wireless communication device that includes a filter in accordance with one or more embodiments.

FIG. 17A is a schematic diagram of a wireless communication 90 device that includes filters 93 in a radio frequency front end 92 according to an embodiment. The filters 93 can include one or more SAW resonators in accordance with any suitable principles and advantages discussed herein. The wireless communication device 90 can be any suitable wireless communication device. For instance, a wireless communication device 90 can be a mobile phone, such as a smart phone. As illustrated, the wireless communication device 90 includes an antenna 91, an RF front end 92, a transceiver 94, a processor 95, a memory 96, and a user interface 97. The antenna 91 can transmit RF signals provided by the RF front end 92. Such RF signals can include carrier aggregation signals. Although not illustrated, the wireless communication device 90 can include a microphone and a speaker in certain applications.

The RF front end 92 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 92 can transmit and receive RF signals associated with any suitable communication standards. The filters 93 can include SAW resonators of a SAW component that includes any suitable combination of features discussed with reference to any embodiments discussed above.

The transceiver 94 can provide RF signals to the RF front end 92 for amplification and/or other processing. The transceiver 94 can also process an RF signal provided by a low noise amplifier of the RF front end 92. The transceiver 94 is in communication with the processor 95. The processor 95 can be a baseband processor. The processor 95 can provide any suitable base band processing functions for the wireless communication device 90. The memory 96 can be accessed by the processor 95. The memory 96 can store any suitable data for the wireless communication device 90. The user interface 97 can be any suitable user interface, such as a display with touch screen capabilities.

Figure 17B:
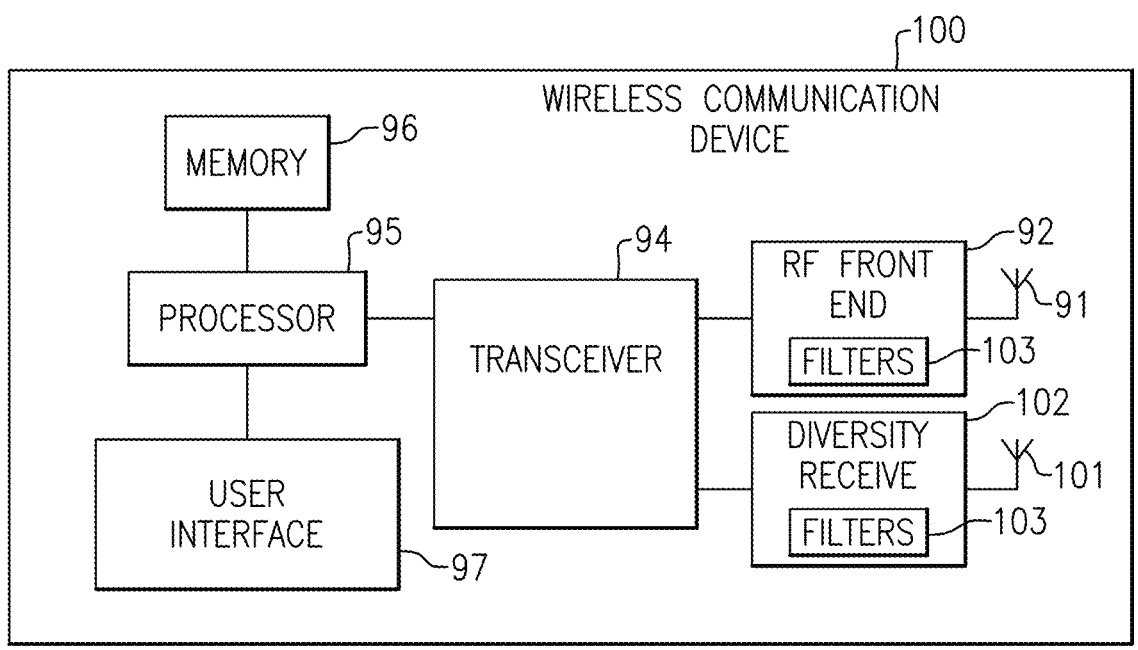
FIG. 17B is a schematic block diagram of another wireless communication device that includes a filter in accordance with one or more embodiments.

FIG. 17B is a schematic diagram of a wireless communication device 100 that includes filters 93 in a radio frequency front end 92 and a second filter 103 in a diversity receive module 102. The wireless communication device 100 is like the wireless communication device 90 of FIG. 17A, except that the wireless communication device 100 also includes diversity receive features. As illustrated in FIG. 17B, the wireless communication device 100 includes a diversity antenna 101, a diversity module 102 configured to process signals received by the diversity antenna 101 and including filters 103, and a transceiver 104 in communication with both the radio frequency front end 92 and the diversity receive module 102. The filters 103 can include one or more SAW resonators that include any suitable combination of features discussed with reference to any embodiments discussed above.

Although embodiments disclosed herein relate to surface acoustic wave resonators, any suitable principles and advantages disclosed herein can be applied to other types of acoustic wave resonators, such as Lamb wave resonators and/or boundary wave resonators. For example, any suitable combination of features of the multi-layer mass loading strips disclosed herein can be applied to a Lamb wave resonator and/or a boundary wave resonator.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 8.5 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An acoustic wave device comprising a multi-layer mass loading strip at least partially overlapping edge portions of a plurality of fingers of an interdigital transducer electrode, the multi-layer mass loading strip having a mass sufficient to suppress at least a portion of a transverse mode, the multi-layer mass loading strip including a first layer and a second layer, the first layer of the multi-layer mass loading strip positioned between the second layer of the multi-layer mass loading strip and the interdigital transducer electrode, and the first layer improves crystal orientation of the second layer.

2. The acoustic wave device of claim 1 wherein the second layer of the multi-layer mass loading strip has a higher mass than the first layer of the multi-layer mass loading strip.

3. The acoustic wave device of claim 1 wherein the second layer of the multi-layer mass loading strip is a conductive strip.

4. The acoustic wave device of claim 1 wherein the first layer of the multi-layer mass loading strip includes titanium.

5. The acoustic wave device of claim 1 wherein the first layer of the multi-layer mass loading strip is an adhesion layer that improves the crystal orientation of the second layer.

6. The acoustic wave device of claim 5 wherein the second layer of the multi-layer mass loading strip includes molybdenum.

7. The acoustic wave device of claim 1 wherein the acoustic wave device is configured to generate a surface acoustic wave.

8. The acoustic wave device of claim 1 wherein the second layer of the multi-layer mass loading strip has a higher density than a density of the interdigital transducer electrode.

9. The acoustic wave device of claim 1 wherein the multi-layer mass loading strip includes a third layer that is an adhesion layer that adheres to a temperature compensation layer.

10. The acoustic wave device of claim 1 wherein the first layer of the multi-layer mass loading strip is spaced apart from a piezoelectric layer.

11. A method of filtering a radio frequency signal, the method comprising:
receiving the radio frequency signal at an input port of an acoustic wave filter that includes an acoustic wave resonator, the acoustic wave resonator including a multi-layer mass loading strip at least partially overlapping edge portions of fingers of an interdigital transducer electrode, the multi-layer mass loading strip including a first layer and a second layer, the first layer of the multi-layer mass loading strip positioned between the second layer of the multi-layer mass loading strip and the interdigital transducer electrode, and the first layer improves crystal orientation of the second layer; and
filtering the radio frequency signal with the acoustic wave filter, the filtering including suppressing a transverse mode using the multi-layer mass loading strip of the acoustic wave resonator.

12. The method of claim 11 further comprising forming the second layer of the multi-layer mass loading strip with a higher mass than the first layer of the multi-layer mass loading strip.

13. The method of claim 11 further comprising forming the second layer of the multi-layer mass loading strip as a conductive strip.

14. The method of claim 11 further comprising forming the first layer of the multi-layer mass loading strip to include titanium.

15. The method of claim 11 wherein the first layer of the multi-layer mass loading strip improves the crystal orientation of the second layer.

16. The method of claim 15 wherein the second layer of the multi-layer mass loading strip includes molybdenum.

17. The method of claim 11 wherein the acoustic wave resonator generates a surface acoustic wave.

18. The method of claim 11 further comprising forming the second layer of the multi-layer mass loading strip to have a higher density than a density of the interdigital transducer electrode.

19. The method of claim 11 further comprising forming a third layer on of the multi-layer mass loading strip that adheres to a temperature compensation layer.

20. The method of claim 11 further comprising spacing the first layer of the multi-layer mass loading strip apart from a piezoelectric layer.

\* \* \* \* \*